US009774801B2

(12) United States Patent
Hseih et al.

(10) Patent No.: US 9,774,801 B2
(45) Date of Patent: Sep. 26, 2017

(54) SOLID STATE IMAGE SENSOR WITH ENHANCED CHARGE CAPACITY AND DYNAMIC RANGE

(71) Applicant: QUALCOMM Incorporated, San Diego, CA (US)

(72) Inventors: Biay-Cheng Hseih, Irvine, CA (US); Sergiu Radu Goma, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/561,845

(22) Filed: Dec. 5, 2014

(65) Prior Publication Data

US 2016/0165159 A1    Jun. 9, 2016

(51) Int. Cl.
*H04N 5/225*    (2006.01)
*H04N 5/355*    (2011.01)
(Continued)

(52) U.S. Cl.
CPC ... *H04N 5/35563* (2013.01); *H01L 27/14632* (2013.01); *H01L 27/14634* (2013.01);
(Continued)

(58) Field of Classification Search
CPC .......... H01L 27/14641; H01L 27/1464; H04N 5/37457
(Continued)

(56) References Cited

U.S. PATENT DOCUMENTS 7,518,759 B2    4/2009    Hosier et al.
7,538,307 B1    5/2009    Lauxtermann
(Continued)

FOREIGN PATENT DOCUMENTS

JP         2000165754 A  *  6/2000   .......... H04N 5/3559
WO    WO-2009051379 A2    4/2009
(Continued)

OTHER PUBLICATIONS

Hondongwa D., et al., "Quanta Image Sensor (QIS): Early Research Progress," In Proc. 2013 Optical Society of America (OSA) Mtg. on Imaging Systems and Applications, Arlington, VA, Jun. 24-27, 2013, pp. 1-3.
(Continued)

*Primary Examiner* — Twyler Haskins
*Assistant Examiner* — Dwight C Tejano
(74) *Attorney, Agent, or Firm* — Knobe, Martens, Olson & Bear, LLP

(57) ABSTRACT

Certain aspects relate to imaging systems and methods for manufacturing imaging systems and image sensors. The imaging system includes a pixel array including a plurality of pixels, the pixels configured to generate a charge when exposed to light and disposed on a first layer. The imaging system further includes a plurality of pixel circuits for reading light integrated in the pixels coupled thereto, each of the plurality of pixel circuits comprising one or more transistors shared between a subset of the plurality of the pixels, the one or more transistors disposed on a second layer different than the first layer. The imaging system further includes a plurality of floating diffusion nodes configured to couple each of the plurality of pixels to the plurality of pixel circuits.

27 Claims, 14 Drawing Sheets

(51) Int. Cl.
  *H04N 5/232* (2006.01)
  *H04N 5/235* (2006.01)
  *H04N 5/3745* (2011.01)
  *H04N 9/04* (2006.01)
  *H01L 27/146* (2006.01)

(52) U.S. Cl.
  CPC ..... *H01L 27/14641* (2013.01); *H04N 5/2355* (2013.01); *H04N 5/23235* (2013.01); *H04N 5/37457* (2013.01); *H04N 9/045* (2013.01); *H04N 2209/046* (2013.01)

(58) Field of Classification Search
  USPC .......................................................... 257/447
  See application file for complete search history.

(56) References Cited

U.S. PATENT DOCUMENTS

| | | | |
|---|---|---|---|
| 8,222,586 | B2 | 7/2012 | Lee |
| 8,547,458 | B2 | 10/2013 | Iwasawa |
| 8,638,382 | B2 | 1/2014 | Itonaga et al. |
| 2003/0058356 | A1 | 3/2003 | DiCarlo et al. |
| 2005/0035381 | A1 | 2/2005 | Holm et al. |
| 2005/0046715 | A1 | 3/2005 | Lim et al. |
| 2005/0110884 | A1* | 5/2005 | Altice, Jr. ......... H01L 27/14603 348/302 |
| 2005/0110885 | A1 | 5/2005 | Altice et al. |
| 2005/0128327 | A1 | 6/2005 | Bencuya et al. |
| 2007/0091190 | A1* | 4/2007 | Iwabuchi et al. ............. 348/294 |
| 2008/0055441 | A1 | 3/2008 | Altice |
| 2008/0083939 | A1* | 4/2008 | Guidash ....................... 257/292 |
| 2008/0170149 | A1* | 7/2008 | Iida et al. .................... 348/315 |
| 2008/0309800 | A1 | 12/2008 | Olsen et al. |
| 2009/0184349 | A1* | 7/2009 | Dungan ........................ 257/292 |
| 2009/0189234 | A1* | 7/2009 | Mabuchi ....................... 257/432 |
| 2010/0019130 | A1* | 1/2010 | Lee ............................ 250/208.1 |
| 2010/0060764 | A1 | 3/2010 | McCarten et al. |
| 2010/0276572 | A1 | 11/2010 | Iwabuchi et al. |
| 2011/0101420 | A1 | 5/2011 | Patel |
| 2011/0163223 | A1 | 7/2011 | Guidash |
| 2012/0050597 | A1 | 3/2012 | Maeda et al. |
| 2013/0264467 | A1* | 10/2013 | Hong ................. H01L 27/14609 250/208.1 |
| 2013/0307103 | A1 | 11/2013 | Lin et al. |
| 2013/0334403 | A1 | 12/2013 | Kozlowski |
| 2014/0008520 | A1 | 1/2014 | Raynor |
| 2014/0077057 | A1* | 3/2014 | Chao et al. ................ 250/208.1 |
| 2014/0263959 | A1 | 9/2014 | Hsu et al. |
| 2015/0229861 | A1 | 8/2015 | Yakemoto |
| 2015/0236065 | A1 | 8/2015 | Eom |

FOREIGN PATENT DOCUMENTS

| | | |
|---|---|---|
| WO | WO-2014051306 A1 | 4/2014 |
| WO | WO-2014064837 A1 | 5/2014 |

OTHER PUBLICATIONS

Vogelsang T., et al., "Overcoming the Full Well Capacity Limit: High Dynamic Range Imaging Using Multi-Bit Temporal Oversampling and Conditional Reset," Rambus Inc., International Image Sensor Workshop, 2013, pp. 1-4.

International Search Report and Written Opinion—PCT/US2015/059732—ISA/EPO—dated Feb. 3, 2016.

* cited by examiner

SOLID STATE IMAGE SENSOR WITH ENHANCED CHARGE CAPACITY AND DYNAMIC RANGE

TECHNICAL FIELD

The systems and methods disclosed herein are directed to photo sensors, and, more particularly, to sub-micron pixels and vertically integrated pixel sensors.

BACKGROUND

The trend in digital cameras and digital imaging is toward smaller pixels to drive megapixel count upward or to enable smaller sensor areas. At the same time, improvements in speeds, sensitivity, and pixel numbers are desired. However, the reduction in size and increase in pixel numbers may not support the desired increase in speeds and sensitivity. Smaller sized pixels can suffer from many challenges. For example, smaller pixels may have lower sensing speeds or degraded resolution and color fidelity, and may have limited dynamic range when compared to larger pixels. Particularly in mobile sensors, the trend to shrink the pixel size and sensor area attempts to maintain performance through advanced processing. Reduced full well capacity, reduced quantum efficiency, and reduced photosensitivity of the sub-micron pixel detector array has greatly degraded signal-to-noise ratio (SNR) and dynamic range of the image sensor. In addition, higher cross-talk of the reduced pixel size results in image quality issues for example poor modulation transfer function (MTF) and color fidelity.

In digital imaging, the dynamic range of a complementary metal-oxide-semiconductor (CMOS) sensor may, at times, be insufficient to accurately represent outdoor scenes. This may be especially true in the more compact sensors which may be used in mobile devices, for example in the camera on a mobile telephone. For example, a typical sensor used in a mobile device camera may have a dynamic range of approximately 60-70 dB. However, a typical natural outdoor scene can easily cover a contrast range of 100 dB between light areas and shadows. Because this dynamic range is greater than the dynamic range of a typical sensor used in a mobile device, detail may be lost in images captured by mobile devices.

SUMMARY

The systems, methods, and devices of the invention each have several aspects, no single one of which is solely responsible for its desirable attributes. Without limiting the scope of this invention as expressed by the claims which follow, some features will now be discussed briefly. After considering this discussion, and particularly after reading the section entitled "Detailed Description," one will understand how the features of the various embodiments of this invention provide advantages that include improved communications between access points and stations in a wireless network.

The embodiments disclosed herein each have several innovative aspects, no single one of which is solely responsible for the desirable attributes of the invention. Without limiting the scope, as expressed by the claims that follow, the more prominent features will be briefly disclosed here. After considering this discussion, one will understand how the features of the various embodiments provide several advantages over current dynamic wireless charging systems.

One aspect of the disclosure provides an imaging system. The imaging system includes a plurality of pixels configured to convert light into a charge. The imaging system further includes one or more amplifier transistors configured to convert a charge from a plurality of pixels, one or more selection transistors configured to select a row or column of the plurality of pixels to be read out, and one or more reset transistors configured to reset at least one of the plurality of pixels. The imaging system also includes a pixel array. The pixel array includes the plurality of pixels arranged in one or more shared pixel architectures. The pixel array is arranged in a plurality of rows and columns and further includes a plurality of transfer gate transistors. Each of the plurality of transfer gate transistors corresponds to one of the plurality of pixels. The imaging system further includes a first silicon layer upon which the plurality of pixels are disposed and a second silicon layer upon which at least one of the one or more amplifier transistors, selection transistors, and reset transistors are disposed.

Another aspect disclosed is another imaging system. The other imaging system includes a plurality of pixels, wherein the pixels are configured to generate a charge when exposed to light. The other imaging system also includes a plurality of pixel circuits, each pixel circuit comprising at least one of a reset transistor, a row selection transistor, or an amplifying transistor. The other imaging system further includes a plurality of shared pixels architectures, the shared pixels architectures comprising one or more pixels of the plurality of pixels and pixel circuits of the plurality of pixel circuits. The other imaging system also includes a pixel array including the plurality of shared pixels architectures. The pixel array arranged in a plurality of rows and columns. Finally, the other imaging system includes a first layer of silicon and a second layer of silicon placed above the first layer of silicon.

Another aspect disclosed is another imaging system. The imaging system includes a pixel array including a plurality of pixels, the pixels configured to generate a charge when exposed to light and disposed on a first layer. The imaging system further includes a plurality of pixel circuits for reading light integrated in the pixels coupled thereto, each of the plurality of pixel circuits comprising one or more transistors shared between a subset of the plurality of the pixels, the one or more transistors disposed on a second layer different than the first layer. The imaging system further includes a plurality of floating diffusion nodes configured to couple each of the plurality of pixels to the plurality of pixel circuits.

Another aspect disclosed is a method of manufacturing a three dimensional (3D) stacked image sensor. The method includes forming a pixel array including a plurality of pixels arranged in one or more shared pixel architectures. The formed pixel array is arranged in a plurality of rows and columns and further includes a plurality of transfer gate transistors, wherein each of the plurality of transfer gate transistors corresponds to one of the plurality of pixels. The method also includes disposing the plurality of pixels on a first silicon layer and disposing at least one amplifier transistor, selection transistor, and reset transistor on a second silicon layer different from the first silicon layer. The method further includes electrically coupling the first silicon layer to the second silicon layer.

BRIEF DESCRIPTION OF THE DRAWINGS

The disclosed aspects will hereinafter be described in conjunction with the appended drawings and appendices, provided to illustrate and not to limit the disclosed aspects, wherein like designations denote like elements.

DETAILED DESCRIPTION

Introduction

Figure 1A:
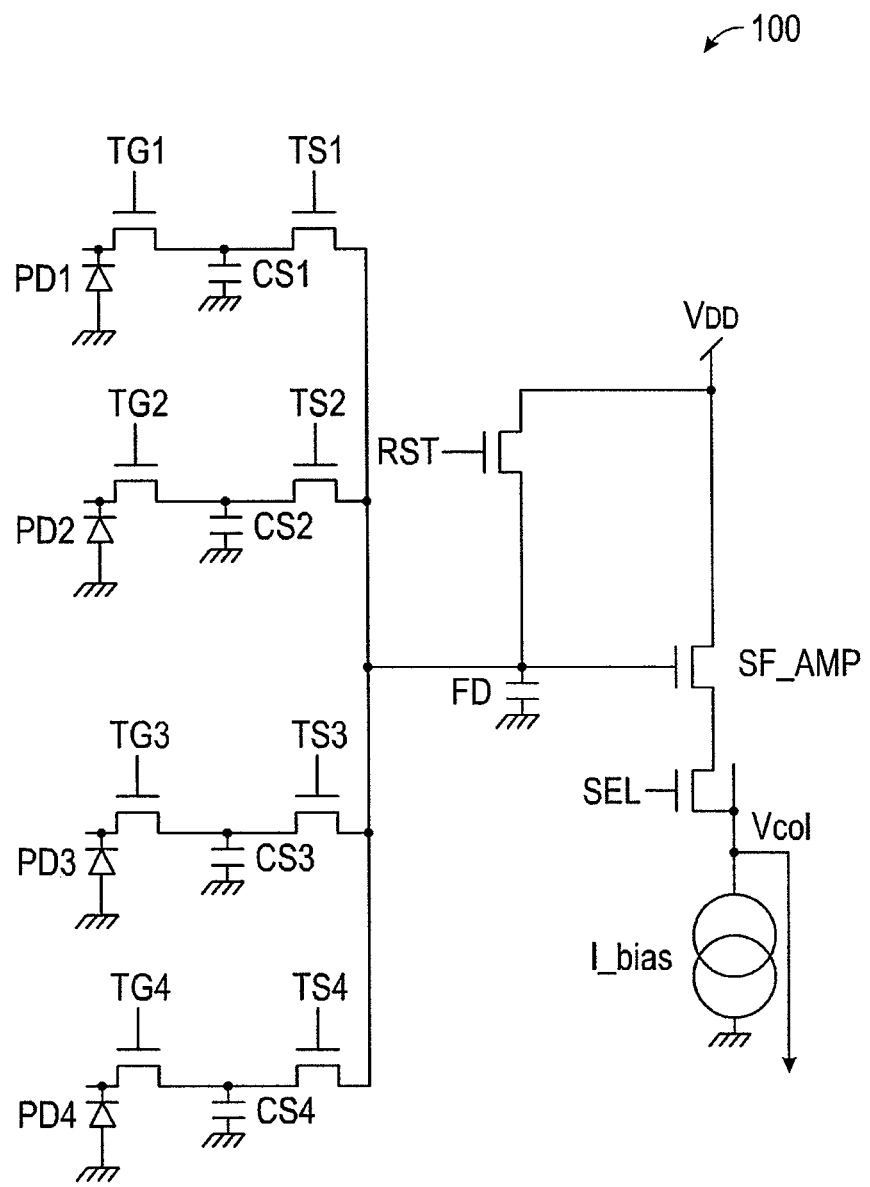
FIG. 1A illustrates an embodiment of a shared-pixels architecture for use as a pixel of a pixel readout system, in accordance with an exemplary embodiment.

Embodiments of the disclosure relate to systems and techniques for generating and implementing sub-micron pixels capable of low-noise and high gain readout, high resolution and high color-fidelity outputs, and increased dynamic range using 3-dimensional (3D) stacked, vertically integrated pixel architectures. As the size of pixels continues to decrease, the components required within the pixel to maintain desired qualities and characteristics of the image capture (e.g., the low-noise, high gain, high resolution and color-fidelity, etc.) reduce the amount of light available to the light sensing structure of the pixel, e.g., the photo-detector, photodiode, or similar structure or device. For example, as the pixel size reduces, there is less physical area in the pixel because the components cannot be eliminated and the size of the components may only be reduced a certain degree based on manufacturing and general technology constraints. Accordingly, additional architectures may be developed that maintain the number and size of components in each pixel while increasing the area with which the photo-detector, photodiode, or similar structure or device is able to absorb light and generate a charge in response to the absorbed light. Readout architecture, including an extra storage capacitor, can implement a signal readout scheme to allow extension of full well capacity, boosting signal-to-noise ratio (SNR) and dynamic range. The associated readout architecture can be implemented, in various embodiments, with a four transistor 4-shared CIS pixel, 8-shared, 16-shared, or other suitable pixel configurations. Pixel readout components, including reset transistors, amplifying transistors, and a timing scheme and the storage capacitor can cooperate to store charges accumulated from the photo-detectors or photodiodes to perform multiple pixel readouts. The terms "pixel" and "photodiode," "photodetector," "photogate," etc., may be used interchangeably herein.

In one example, where a transfer gate, timing circuit, and reset transistor are all activated, a photodiode and a floating diffusion node can be reset. Additionally, charge integration in the storage capacitor can occur when the transfer gate, timing circuit, and reset transistor are all off, allowing photon charge to be collected in a photodiode. After the charge accumulates in the photodiodes In some embodiments, the storage capacitor may be used for charge integration. The storage capacitor may allow smaller dumps from the photodiode to be stored in the storage capacitor. Accordingly, the charge in the storage capacitor becomes larger as more dumps from the photodiodes are combined. When the timing circuit is turned on one or more times in conjunction with the transfer gate, the charge in the photodiode can be dumped to the storage capacitor. Accordingly, the storage capacitor can hold charges from multiple reads of a pixel or group of pixels.

In some examples, the main source of noise within a CMOS pixel is kTC (or reset) noise from the resetting of the storage capacitor and/or capacitive floating diffusion node through the resistive channel of the reset transistor (a few tens of electrons). One embodiment of a readout mode that can be implemented using embodiments of the architecture described herein can include a first read performed immediately after a reset or before another voltage is applied to the storage capacitor and/or capacitive floating diffusion node. This first readout can store the kTC noise in the memory as a baseline. Such kTC noise can originate from the reset noise of capacitors, and it can be desirable, for enhancing image quality, to reduce, eliminate, or otherwise compensate for the kTC noise. Accordingly, a second readout can be performed after charge integration in the storage capacitor (for example including multiple charge dumps from a pixel or pixels, where the photon generated charges integrate) by turning on the selector circuit again. Due to the additional charge storage capacity of the storage capacitor and the multiple photodiode charge dumps controlled by the timing scheme, the two readouts can provide multiplication of the pixel full well capacity proportionate to the number of charge dumps. Because the kTC noise was stored in the memory as a baseline in the first frame, this readout method can compensate for the kTC noise in the second readout. By performing two readouts, for example by sampling the storage capacitor or floating diffusion node after the storage capacitor and/or floating diffusion node is reset but before the transfer gate is turned on and after the transfer gate is turned on, correlated double sampling with a short sampling time can be performed, thus eliminating kTC noise.

Another embodiment of a readout mode that can be implemented using embodiments of the full well capacity extension architecture described herein can perform multiple readouts and obtain the charge difference between two charge dumps from a photodiode. The resulting differential frame can be kTC noise free. In some embodiments, the multiple readouts can be performed in a low bit depth mode to conserve power if high accuracy is not needed, for example for a viewfinder preview image or for auto-exposure adjustments. In some embodiments, the multiple readouts can be performed in normal bit depth mode for more accurate image information. In some embodiments, for example high dynamic range (HDR) imaging, two different integration times can be used for the charge dumps in two readouts used to generate the differential frame.

A pixel readout system can be used for any CMOS, CCD, or other image sensor. In some embodiments, the sensor can be, for example, a 32 MP/30 fps image sensor having approximately 0.5 μm pixels with approximately 1000-e full well capacity. The image sensor can be designed to have 10b/240-fps readout speed. Some embodiments of the image sensor can be a digitally integrated design with 8-frame accumulation shutter speed, for example, implementing an interleaved rolling shutter with no need to store a full frame. In one example, data can be output from an external memory, for example DRAM, at speeds of approximately 12b/30-fps. Such an image sensor can result in an equivalent pixel full well capacity multiplied by a factor of eight, for example reaching approximately 8000-e full well capacity per pixel. These image sensor specifications represent just one embodiment of an image sensor using the pixel readout system, and other image sensors with varying specifications can be used in other embodiments.

A pixel array may include a plurality of pixels arranged in a predetermined number of rows and columns (e.g., M rows and N columns). Each pixel may represent a single charge detecting element of the pixel array. Each of the plurality of pixels can each include a photosensitive element, for example a photogate, photoconductor, photodiode, or other photodetector, overlying a substrate for accumulating photo-generated charge in an underlying portion of the substrate. The pixel array can, in some embodiments, include one or more filters positioned to filter incoming light, for example a cut-off filter or a color filter. For example, the photosensitive element of a CMOS pixel can be one of a depleted p-n junction photodiode or a field-induced depletion region beneath a photogate.

A timing generator can provide timing signals for reading out values representing light accumulated in each of the pixels of the pixel array. For example, the timing generator can be a column and row driver. Timing generator can include control logic for controlling reset operations, exposure time, line time, and pixel time for the pixel array and can also provide timing signals to an analog/digital converter (ADC). The readout circuitry can provide circuitry for reading out each of the pixels in the pixel array. For example, the readout circuitry can include a plurality of row and column lines provided for the entire array. The column and row lines of the readout circuitry can be electronically connected to column sample and hold (S/H) circuitry, pixel circuitry, and row control circuitry that operate according to the timing provided by the timing generator. In operation, the pixels of each row in the pixel array can be turned on at the same time by a row select line and the pixels of each column can be selectively output by a column select line.

Each pixel may include circuitry for reading a charge collected in each of the plurality of pixels. For example, one embodiment of the pixel circuitry is connected to each pixel and includes an output field effect transistor formed in the substrate and a charge transfer section formed on the substrate adjacent the pixel having a sensing node, typically a floating diffusion node, connected to the gate of an output transistor. The charge transfer section of the pixel circuitry can include at least one electronic component, for example a transistor, for transferring charge from the underlying portion of the substrate to the floating diffusion node and another electronic component, for example a reset transistor for resetting the node to a predetermined charge level prior to charge transference. Photo charge may be amplified when it moves from the initial charge accumulation region to the floating diffusion node, and the charge at the floating diffusion node can be converted to a pixel output voltage by a source follower output transistor. As discussed in more detail below, the pixel circuitry can further include a storage capacitor or other electronic charge storage device for storing multiple charge dumps from a pixel or pixels in the analog domain. The storage capacitor may be positioned beyond the floating diffusion node in the pixel circuitry (relative to the position of the pixel) in some embodiments, and can have a capacitance greater than that of the floating diffusion node. The storage capacitor can be on the same sensor chip or in the bottom chip of a stack-die with pixel-to-pixel connection in various embodiments.

After passing through the pixel circuitry, pixel signals may be passed through an amplifier to increase the strength of the pixel signal (e.g., the voltage or current). The timing generator, the pixel array, the pixel circuitry, and the amplifier together may perform the functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. The three-dimensional (3-D) stacked or shared-pixels architecture described herein can perform these functions while reducing the pixel size and increasing the number of pixels in the same area while increasing speeds, sensitivity, resolution, dynamic range, and color fidelity of the pixel array.

FIG. 1A illustrates an embodiment of a shared-pixels architecture 100 for use as a pixel of a pixel readout system, in accordance with an exemplary embodiment. Some embodiments of the image sensor can be a solid-state image sensor, for example a CMOS image sensor, which has four four-transistor (4T) pixels sharing pixel circuitry and a compact layout. The 4T 4-shared-pixels architecture 100 can be used as the pixel architecture for pixels in the pixel array, in some embodiments. The 4T 4-shared-pixels architecture 100 includes four pixels, and though many such similar shared-pixels architectures exist and may be arranged in the array in a similar manner, for simplicity only one 4T 4-shared-pixels architecture 100 is shown in greater detail.

The 4T 4-shared-pixels architecture 100 includes four photodiode circuits in parallel. The photo diode circuits comprise photodiodes PD1-PD4 and their corresponding transfer gates TG1-TG4. Each of the photodiode circuits also comprises a timing circuit TS1-TS4 and a storage capacitor CS1-CS4 in series with the respective photodiodes PD1-PD4 between the photodiodes PD1-PD4 and a floating diffusion node. The individual storage capacitors CS1-CS4 for each of the photodiodes PD1-PD4 may be used to temporarily store charge absorbed by each of the photodiodes PD1-PD4 before the charge is transferred to the floating diffusion node. The pixel readout system may comprise a floating diffusion node FD, reset transistor RST, voltage supply VDD, source follower amplifier SF_AMP, selector transistor SEL, output voltage node Vcol, and current source Ibias. These elements can perform similar functions as described above. Sharing of the floating diffusion node FD, source follower amplifier SF_AMP, row select transistor SEL, and reset transistor RST between adjacent photodiodes PD1-PD4 and transfer gates TG1-TG4 assists in increasing the fill factor of the pixel architecture, the fill factor representing the percentage of the pixel area that is sensitive to light. The fill factor is increased because the sharing of components between multiple pixel architectures reduces the total number of transistors, capacitors, and other components, coupled to a larger number of shared-pixels in the shared-pixels architecture 100. Thus, the sharing of components among a plurality of pixels reduces the area of the pixel filled with transistors and other components, and thus increases the area of the pixel that is sensitive to light. The illustrated architecture 100 results in approximately 2.0 transistors per pixel. Components can be shared by four separate photodiodes and associated transfer gates. In some embodiments, the shared components may be shared by eight separate photodiodes or 16 separate photodiodes or more separate photodiodes.

In some embodiments, photodiodes PD1-PD4 can include one photodiode used to detect a red component of incoming light, two photodiodes used to detect a green component of incoming light, and one photodiode used to detect a blue component of incoming light. Though not shown in this figure, the color representation described may follow the Bayer color pattern, wherein a shared architecture comprises two green pixels in diagonal and one red pixel in diagonal with one blue pixel in a four-pixel architecture. In some embodiments, the floating diffusion node FD of FIG. 1A may represent one or more floating diffusion nodes. For example, each photodiode circuit may have an individual floating diffusion node (not shown in this figure). In some embodiments, two or more photodiode circuits may share one or more floating diffusion nodes (not shown in this figure). However, as depicted herein, the one or more floating diffusion nodes may be combined into a single floating diffusion node FD in the figures for simplicity of the schematics.

Charge can be collected by each of the photodiodes PD1-PD4 as long as the corresponding transfer gates TG1-TG4 are off. Once the charges have accumulated in the photodiodes PD1-PD4, the accumulated charges in each of the photodiodes PD1-PD4 may be temporarily transferred to the respective storage capacitors CS1-CS4. For example, the charge that accumulates in photodiode PD1 when the transfer gate TG1 is closed and the photodiode is exposed to light of the specified color may be transferred to the storage capacitor CS1 when the transfer gate TG1 is opened. Once the charges are placed in the storage capacitors CS1-CS4, the transfer gates TG1-TG4 may be closed. In some embodiments, the storage capacitors CS1-CS4 may have larger charge capacities than the photodiodes PD1-PD4, and the storage capacitors CS1-CS4 may receive multiple charge dumps from their respective photodiodes PD1-PD4 before the charges in the storage capacitors CS1-CS4 are transferred to the floating diffusion node FD. The charges may be further transferred to the floating diffusion node FD when the respective timing circuits TS1-TS4 are activated while the transfer gates TG1-TG4 are closed. In some embodiments, both the transfer gates TG1-TG4 and the timing circuits TS1-TS4 may be open at the same time, thus allowing both the accumulated charges in the photodiodes PD1-PD4 and the charges in the storage capacitors CS1-CS4 to accumulate in the floating diffusion node FD. The individual storage capacitors CS1-CS4 and timing circuits TS1-TS4 allow charges from the corresponding photodiodes PD1-PD4 to be transferred to the floating diffusion node FD individually.

The intermediate storage of charge in the storage capacitors CS1-CS4 between the photodiodes PD1-PD4 and the floating diffusion node FD may be useful in discerning charge contributions from individual photodiodes PD1-PD4. Without the individual storage capacitors CS1-CS4, in some embodiments, a single, shared storage capacitor or floating diffusion node FD may have difficulty supporting multiple charge transfers from multiple photodiodes PD1-PD4 without losing signal and creating artifacts. When charge is transferred directly from the photodiodes PD1-PD4 to the floating diffusion node FD after the charging/integration time, the floating diffusion node FD, which may comprise a parasitic capacitor inside the silicon wafer of the photodiodes PD1-PD4, may not hold enough charge for extending the dynamic range of a sensor with small pixels. Accordingly, the charge from the photodiodes PD1-PD4 can be dumped multiple times to their respective storage capacitors CS1-CS4 before the charges from each of the storage capacitors CS1-CS4 are readout individually through the floating diffusion node FD to the readout circuitry described above. The storage capacitors CS1-CS4, as described above, can be configured with an effective capacitance large enough to store multiple charge dumps from their respective photodiodes PD1-PD4, for example eight or more charge dumps. In some embodiments, the full well capacity of a pixel can be effectively multiplied in the analog domain by the number of charge dumps stored in the storage capacitors CS1-CS4. In some embodiments, the storage capacitors CS1-CS4 and the timing circuits TS1-TS4 are formed on the same layer as the photodiodes PD1-PD4 in the shared-pixels architecture 100. In some embodiments, the storage capacitors CS1-CS4 and the timing circuits TS1-TS4 may be formed on the second layer, along with the remaining components of the readout circuitry.

In one example, where one or more of the transfer gates TG1-TG4, timing circuits TS1-TS4, and reset transistor RST are all on, the corresponding one or more photodiodes PD1-PD4, the one or more storage capacitors CS1-CS4, and the floating diffusion node FD can be reset, dependent upon which TG1-TG4 and TS1-TS4 are activated. In some embodiments, the photodiodes PD1-PD4 and the storage capacitors CS1-CS4 may each be reset before being exposed to the light source. Charge integration in the photodiodes PD1-PD4 can occur when the respective transfer gates TG1-TG4 are off, allowing photon charge to be collected in the corresponding photodiode PD1-PD4. Charge integration in the storage capacitors CS1-CS4 can occur when the respective timing circuits TS1-TS4 are off and the respective transfer gates TG1-TG4 are open to allow charge from the photodiodes PD1-PD4 to accumulate in the storage capacitors CS1-CS4.

In some embodiments, charge integration in the photodiodes PD1-PD4 can occur when the respective transfer gates TG1-TG4, timing circuits TS1-TS4, and reset transistor RST are all off, allowing photon charge to be collected in the corresponding photodiode PD1-PD4. By selectively turning on the transfer gate TG1-TG4, the charge in the corresponding photodiode PD1-PD4 (for example, the one or more photodiodes PD1-PD4 having an associated transfer gate turned on) is transferred to the floating diffusion node FD via the storage capacitors CS1-CS4 and the timing circuits TS1-TS4. In some embodiments, one or more transfer gates TG1-TG4 and the timing circuits TS1-TS4 can be turned on simultaneously to transfer charge directly from associated photodiodes PD1-PD4 directly to the floating diffusion node FD without storing it in the storage capacitors CS1-CS4. When a row or column of photodiodes PD1-PD4 is selected to be readout by activation of the SEL transistor, the charge stored in the floating diffusion node FD is converted to a voltage through the amplifier SF_AMP. This readout voltage may be transferred on the Vcol output. In some embodiments, the charge stored in one of the storage capacitors CS1-CS4 can be converted to a voltage through the amplifier SF_AMP when the respective timing circuits TS1-TS4 are turned on, and this readout voltage may be transferred on the Vcol output. In some embodiments, if desired, the charged stored in one of the photodiodes PD1-PD4 can be converted to a voltage through the amplifier SF_AMP when the respective transfer gates TG1-TG4 and timing circuits TS1-TS4 are turned on.

In some embodiments, the timing circuits TS1-TS4 can include high-speed logic for regulating the number of charge dumps sent from the photodiodes PD1-PD4 to the storage capacitors CS1-CS4 and for determining when to open to allow the charge in the respective storage capacitors CS1-CS4 to be readout via the floating diffusion node. In some embodiments, only one storage capacitor of the storage capacitors CS1-CS4 may be readout by the readout circuitry at one time. Thus, the timing circuits TS1-TS4 may be coordinated so that no two are open together. By accumulating multiple charge dumps from the photodiodes PD1-PD4 in the analog domain, device power can be saved in comparison to accumulating multiple charge dumps from the photodiodes PD1-PD4 in the digital domain. Sequential readout of photodiodes PD1-PD4 using the timing circuits TS1-TS4 and the readout circuitry can control the readout of photodiodes PD1-PD4 to increase resolution in comparison to parallel scanning. Due to the high speed logic of the timing circuits TS1-TS4, high video frame rates (e.g., 30 fps at 8 MP full resolution) can still be achieved while sampling each photodiode PD1-PD4 in the pixel array multiple times in the analog domain, for example eight readouts per pixel per frame. In some embodiments, the timing scheme can be a transistor with a line width of approximately 20 nm.

Figure 1C:
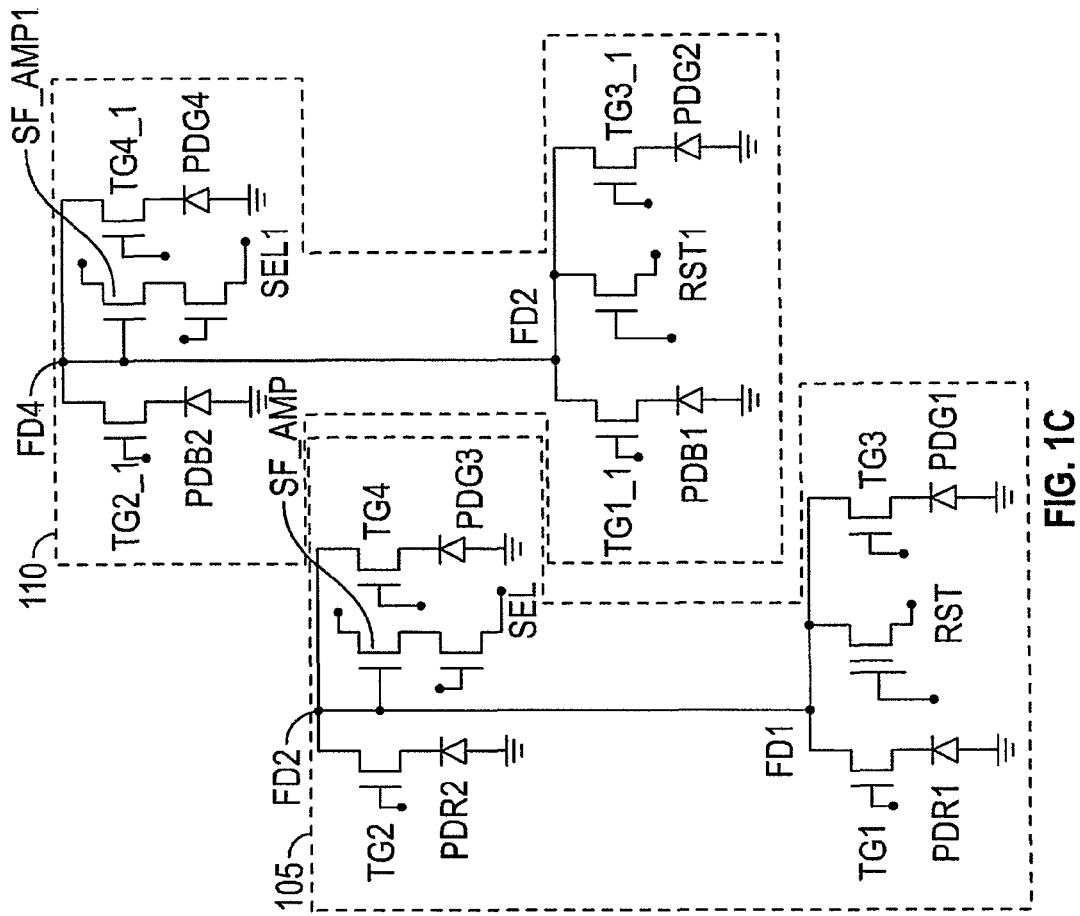
FIG. 1C illustrates an embodiment of two four transistor 4-shared-pixels architecture of FIG. 1B in an interlaced pixel architecture array, in accordance with an exemplary embodiment.
Figure 1B:
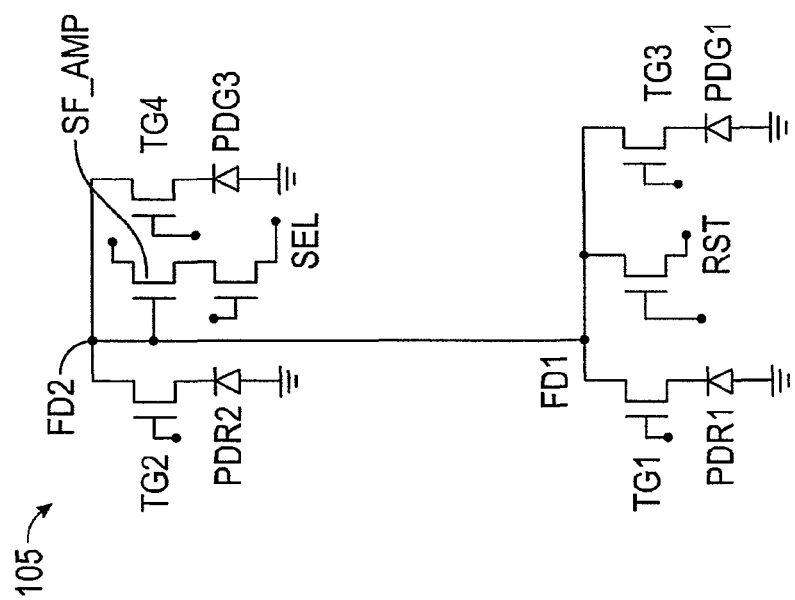
FIG. 1B illustrates an embodiment of an interlaced four transistor 4-shared-pixels architecture, in accordance with an exemplary embodiment.

FIG. 1B illustrates an embodiment of an interlaced four transistor 4-shared-pixels architecture, generally designated as a first architecture 105, in accordance with an exemplary embodiment. As shown in FIG. 1B, there are four photodiodes PDR1, PDR2, PDG1, and PDG3 (or similar structures or devices), with one pair of photodiodes for a first color, for example red (PDR1 and PDR2), and a second pair of the photodiodes for a second color, for example green (PDG1 and PDG3). These photodiodes PDR1, PDR2, PDG1, and PDG3 may correspond to the photodiodes PD1-PD4 as referenced in FIG. 1A. As described above, each of the photodiodes PDR1, PDR2, PDG1, and PDG3 have a dedicated transfer gate TG1-TG4 to control the integration time of charges at each of the respective photodiodes PDR1, PDR2, PDG1, and PDG3. Thus, transfer gate TG1 controls the integration and transfer of charge in the photodiode PDR1, while the transfer gate TG2 controls the integration and transfer of charge in the photodiode PDR2. Similarly, transfer gates TG3 and TG4 of FIG. 1B control the integration and transfer of charge in photodiodes PDG1 and PDG3, respectively. As discussed above, the three transistors shown between the pairs of photodiodes PDR1-PDR2 and PDG1-PDG3 are shared between the four photodiodes PDR1, PDR2, PDG1, and PDG3. The transistor at the top of this column of transistors is the amplifying transistor SF_AMP, the middle transistor is the selection transistor SEL, and the bottom transistor is the reset transistor RST. Two floating diffusion nodes FD1 and FD2 are shown, FD1 being located between the photodiodes PDR1 and PDG1 and the amplifying transistor SF_AMP and FD2 being located between the photodiodes PDR2 and PDG3 and the amplifying transistor SF_AMP. In some embodiments, the two floating diffusion nodes FD1 and FD2 may be combined into a single floating diffusion node or split into additional floating diffusion nodes. Not shown in the shared pixel circuitry is the timing circuitry TS and the storage capacitor CS, though in some embodiments, these two components may be included in the shared pixel circuitry.

The photodiodes PDR1 and PDR2 are the two photodiodes in the left-most column of the schematic of FIG. 1B. The photodiodes PDR1 and PDR2 are configured to sense red light. Thus, when red light is sensed, the photodiodes PDR1 and PDR2 each generate a charge in response to the amount of red light sensed over a period of time. Similarly, the photodiodes PDG1 and PDG3 are the two photodiodes in the right-most column and are each configured to sense green light, each generating a charge when green light is sensed. The center column comprises the shared transistors SFAMP, SEL, and RST and the shared floating diffusion points FD1 and FD2. The SF_AMP, as described above, may be configured to convert the charge input from one of the photodiodes PDR1, PDR2, PDG1, and PDG3 into corresponding voltage signals to be output during a readout sequence. The selection transistor SEL may be configured to select a single row of the pixel array to be readout (or output), as described above and may allow the amplifying transistor SF_AMP to convert a charge to a voltage when a given row or column is selected. Finally, the reset transistor RST may be configured to clear (or set to a reference point) the charge of each the photodiodes PDR1, PDR2, PDG1, and PDG3 and floating diffusion nodes FD1 and FD2. To reset the photodiodes PDR1, PDR2, PDG1, and PDG3, the reset transistor RST may need to be turned on in conjunction with the transfer gates TG1, TG2, TG3, and TG3, respectively.

FIG. 1C illustrates an embodiment of two four transistor 4-shared-pixels architecture of FIG. 1B in an interlaced pixel architecture array, in accordance with an exemplary embodiment. A first four transistor 4-shared-pixels architecture may correspond to the first architecture 105 from FIG. 1B. A second four transistor 4-shared-pixels architecture may be depicted as a second architecture 110. As described above in relation to FIG. 1B, the first four transistor 4-shared-pixels architecture 105 on the left comprises photodiodes PDR1, PDR2, PDG1, and PDG3 along with transistors SF_AMP, SEL, and RST and floating diffusion nodes FD1 and FD2. Similarly, the second four transistor 4-shared-pixels architecture 110 on the right comprises photodiodes PDB1, PDB2, PDG2, and PDG4 along with transistors SF_AMP1, SEL1, and RST1 and floating diffusion nodes FD3 and FD4. The components of the second four transistor 4-shared-pixels architecture 110 function the same as the components described above in relation to FIGS. 1A and 1B, with the photodiodes PDB1 and PDB2 being configured to generate a current in response to sensed blue light. PDG2 and PDG4 of the second four transistor 4-shared-pixels architecture generate current signals in response to exposure to green light in addition to those generated by PDG1 and PDG3. Floating diffusion node FD3 may be located between the photodiodes PDB1 and PDG1 and the amplifying transistor SF_AMP1 and FD4 may be located between the photodiodes PDB2 and PDG4 and the amplifying transistor SF_AMP1.

The combination of the two four transistor 4-shared-pixels architectures 105 and 110 may provide a color representation following the Bayer color pattern, where every full unit comprises two green pixels (for example, one green-odd pixel and one green-even pixel) in diagonal paired with the blue pixel and the red pixel in diagonal. Accordingly, in some embodiments, PDG1 and PDG3 may be referred to as green-odd photodiodes while PDG2 and PDG4 may be referred to as green-even photodiodes. In some embodiments, other color patterns may be used in an interlaced array; the selection between the various color patterns may be dependent at least upon an application of the pixel array.

The shared components in the center column of the second architecture 110 comprise the transistors SF_AMP1, SEL1, and RST1 and the floating diffusion points FD3 and FD4. The SF_AMP1, as described above, may be configured to convert the charge input from one of the photodiodes PDB1, PDB2, PDG2, and PDG4 into corresponding voltage signals to be readout. The selection transistor SEL2 may be configured to select a single row of the second architecture 110 pixel array to be readout (or output), as described above. Finally, the reset transistor RST1 may be configured to clear the charge of each photodiodes PDB1, PDB2, PDG2, and PDG4 and floating diffusion nodes FD3 and FD4. To clear the charge of each of photodiodes PDB1, PDB2, PDG2, and PDG4, the respective transfer gates TG1_1, TG2_1, TG3_1, and TG4_1 may be activated in conjunction with the reset transistor RST1.

Figure 2:
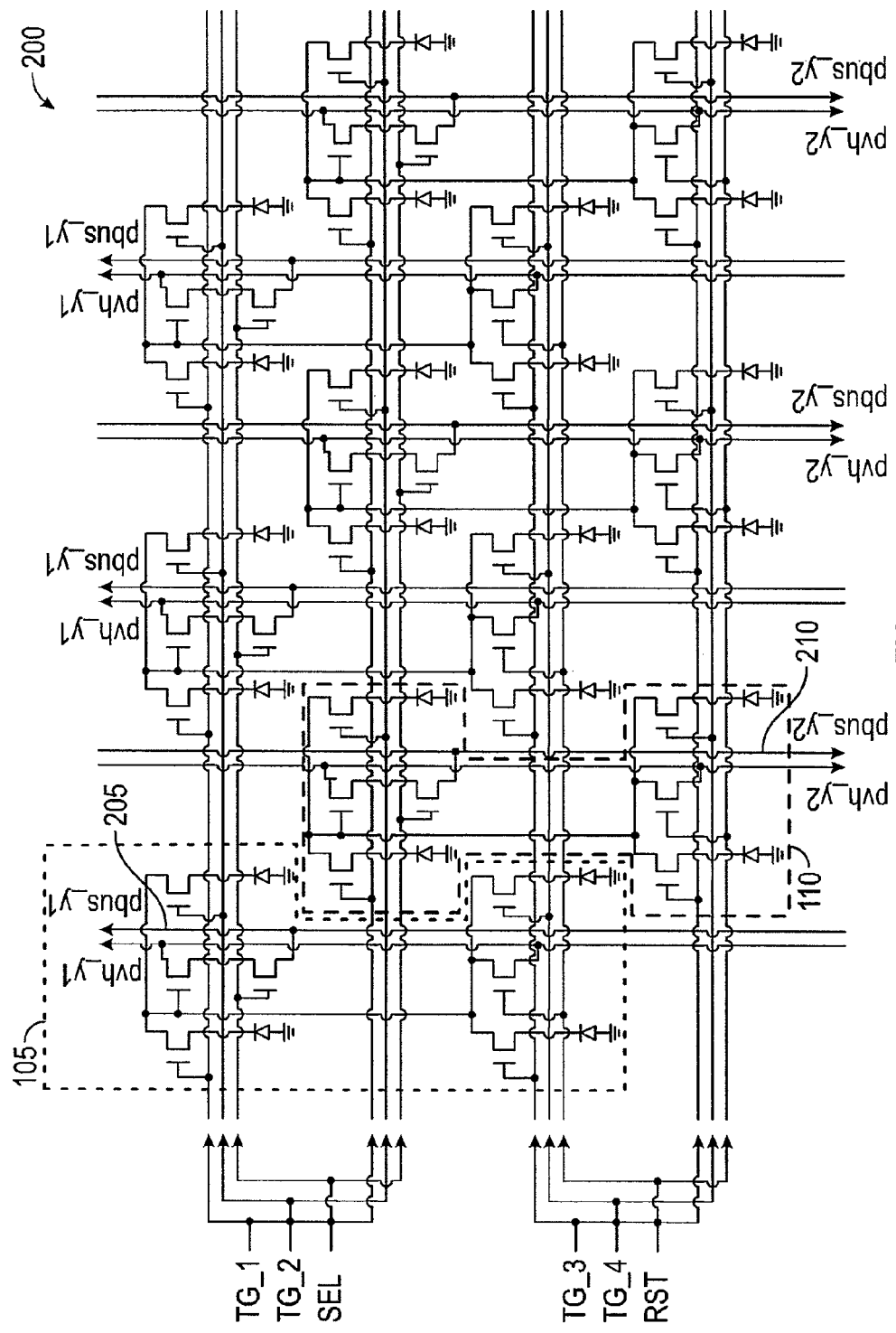
FIG. 2 depicts the four transistor 4-shared-pixels architectures of FIGS. 1B and 1C in an interlaced pixel architecture array, in accordance with an exemplary embodiment.

FIG. 2 depicts the four transistor 4-shared-pixels architectures 105 and 110 of FIGS. 1B and 1C in an interlaced pixel architecture array designated interlaced array 200, in accordance with an exemplary embodiment. FIG. 2 may depict how the interlaced architectures 105 and 110 of FIGS. 1B and 1C may line up physically. For example, the four transistor 4-shared-pixels architectures 105 and 110 of FIG. 1C are shown forming the interlaced array 200 of six four transistor 4-shared-pixels architectures (three each of both 105 and 110). For example, the first row of 4-shared-pixels architectures may be pixel architectures 105, while the second row of 4-shared-pixels architectures may be pixel architectures 110. Though not individually labeled as such in this figure, each of the six four transistor, 4-shared-pixels architectures comprises the components described above in relation to FIGS. 1B and 1C (e.g., each comprises four photodiodes (not labeled individually in this figure), four transfer gate transistors (not labeled individually in this figure), and shared reset, selection, and amplifying transistors (not labeled individually in this figure)). The transfer gate transistors and the reset and selection transistors of each four transistor 4-shared-pixels architecture are further coupled to the buses indicated on the left side of FIG. 2. The embodiment illustrated in FIG. 2 depicts twelve buses associated with six signals, each of the six signals being communicated on two separate buses.

The two separate buses for each signal may be used to communicate with the separate shared-pixels architectures due to the interlaced layout in the array, wherein the photodiodes and transistors of adjacent pixel architectures forming the interlaced array 200 are not all aligned in a single horizontal direction. For example, the transistors for each 4-shared-pixels architecture 105 may not be in a single row horizontally across the array, and are instead separated into alternating rows of red and green-even photodiodes PDRm and PDGn, where m represents the number of the photodiode PDX being depicted and n represents the number of the photodiode PDX being depicted, respectively, and blue and green-odd photodiodes PDBm and PDGn, respectively. Thus, due to the interlaced array 200, the TG1_m transistors of two adjacent 4-shared-pixels architectures 105 and 110 may not be in a single row, but rather in two rows offset from each other. Accordingly two buses are used to communicate the TG_1 signal to all of the TG1_m transistors of a given row of interlaced adjacent 4-shared-pixels architectures 105 and 110. Similarly, two buses are used communicate the TG_2, TG_3, TG_4, SEL, and RES signals to all of the respective transistors of a given "row" of adjacent 4-shared-pixels architectures, wherein, as described above, the adjacent shared-pixels architectures 105 and 110 of the interlaced array 200 are offset from one another. This architecture of horizontal buses may alternate across the array vertically such that each shared-pixels architecture 105 and 110 of the interlaced array 200 may connect to each of the buses for the respective transistors. Accordingly, the transfer gates of FIGS. 1B and 1C above are coupled to the TG_1 and TG_2 bus lines of FIG. 2, respectively. Similarly, the transfer gates of FIGS. 1B and 1C above are coupled to the TG_3 and TG_4 bus lines of FIG. 2, respectively. The reset transistors of the four transistor 4-shared-pixels architectures 105 and 110 of FIG. 2 are each coupled to the reset bus line RST. Similarly, the select transistors of the four transistor 4-shared-pixels architectures 105 and 110 of FIG. 2 are each coupled to the selection bus line SEL.

Additionally, the amplifying transistors and the selection transistors are each further coupled to one of the vertical channels indicated on the top and bottom of FIG. 2. The FIG. 2 depicts readout channels that readout a voltage corresponding to the charge stored in the photodiodes. The readout channels alternate in upward/downward vertical directions, wherein each of the photodiodes of a given four transistor 4-shared-pixels architecture 105 and 110 are connected to a single channel. For example, shared architecture 105 is connected to the readout channel 205, while the shared architecture 110 is coupled to the readout channel 210. The readout channel 205 comprises pbus_y1 and pvh_y1, wherein the voltage from pbus_y1 is transferred to pvh_y1 via the selection transistor and the amplifying transistor based on the charge within the photodiode being readout when the row selection transistor is active and the transfer gate transistor is active for the particular photodiode. These readout channels may each be coupled to the amplifying and selection shared transistors of the shared-pixels architectures such that the charges of the photodiodes of the shared-pixels architectures 105 and 110 across the interlaced array 200 are output via the readout channels 205 and 210. Thus, each pair of readout channels may be configured to output signals from two columns of shared-pixels architectures 105 and 110 of the interlaced array 200.

Each of the readout signal channels of the pair of readout channels described above may be dedicated to a specific pair of colors. For example, in FIG. 2, the pvh_y1/pbus_y1 readout channel may be dedicated to reading-out signals from the red photodiodes and the green-even photodiodes, while the readout channel pvh_y2/pbus_y2 may be dedicated to reading-out signals from the blue photodiodes and the green-odd photodiodes. In some embodiments, the readout channels may be disposed along the interlaced array 200 such that the readout channel/photodiode color correlation is maintained. Additionally, in order to obtain a 1-color-per-channel readout where the channels, as described above, are dedicated to a shared-pixels architecture having photodiodes of two colors, individual colors from the coupled shared-pixels architecture are readout at specific times. Thus, each readout channel of the pair of readout channels may be configured to readout according to a timing scheme, alternating between the two photodiode colors of the coupled shared-pixels architecture 105 or 110, such that a single color is readout on the channel at a particular moment. Such a timing scheme is described in further detail below in reference to FIGS. 3A, 3B, 6A, and 6B.

In the functioning interlaced array 200, each photodiode of each shared-pixels architecture 105 and 110 may generate a charge when exposed to their respective colors of light. However, while the respective transfer gate associated with the photodiode generating the charge is closed, the charge is not transferred away from the photodiode. For example, when photodiode PD1 of FIG. 1A is exposed to red light, the photodiode PD1 may generate a charge. While transfer gate TG1 is closed, the charge is not transferred away from the photodiode PD1 and is instead integrated (e.g., accumulates) in the photodiode PD1. When the transfer gate TG1 receives a signal on the TG_1 bus, transfer gate TG1 may open, allowing the charge from the photodiode PD1 to transfer to the floating diffusion node FD1. The floating diffusion node FD1 may store the charge received from the PD1 over time. The floating diffusion node FD1 may be reset if the reset transistor RST receives a reset signal from the RST bus, or may alternatively output the integrated charge via the amplifying transistor SF_AMP in response to the selection transistor SEL receiving a selection signal from the SEL bus. In some embodiments, though not shown, the floating diffusion node FD1 may transfer the charge stored therein to a storage capacitor CS1. When the selection transistor SEL receives a selection signal, the amplifying transistor SF_AMP may convert the integrated charge to be output on the readout channel pvh_y1/pbus_y1. This process may be similarly applied to each photodiode PD of the shared-pixels architecture 105 and 110 such that the readout channel may be dedicated to a single color at any given moment.

The shared-pixels architecture 105 and 110 depicted in FIGS. 1B-2 may provide various advantages with respect to the depicted layout and architecture. For example, the vertical readout channels may provide a 1-color-per-channel readout when the readouts are performed according to a timing scheme. In a 1-color-per-channel readout, each color has a dedicated channel at a given point in time. As shown in FIG. 2, the first four-shared-pixels architecture may comprise red photodiodes PDR1 and PDR2 with green odd photodiodes PDG1 and PDG3. Thus, the vertical readout channel 205 may be dedicated to a single color when paired with a timing scheme that alternates between reading out the red photodiodes PDR1 and PDR2 and the green odd photodiodes PDG1 and PDG3. Thus, the green odd and red colors have a dedicated channel when being readout. The same applies for the green even and blue photodiodes PDG2, PDG4, PDB1, and PDB2.

The one color-per-channel readout made available by the integrated 4-shared-pixels architecture 105 and 110 may have advantages of its own, including the ability to deliver signals with lower noise and higher gain than the signals delivered by channels shared by more than one color. This may result from each channel being fully separate from the other channels, allowing changes for one signal to be kept independent from the other signals. Additionally, the one color-per-channel may provide a lower fixed-pattern noise than embodiments where multiple colors share a channel, because the photodiodes are not combined in a single channel, and offset and gain error corrections may be applied color-independent. Furthermore, the one color-per-channel readout may result in shared row control and smaller areas for the shared-pixels architecture 105 and 110 and thus the interlaced array 200. The separate channels per color may also provide for parallel processing capabilities, such that high resolution devices (for example, HD cameras and digital SLR cameras) are able to process the high resolutions at a high data rate. Additionally, temporal noise may be reduced by the separate channels because smaller capacitors (e.g., storage capacitors) may be used, which contribute to the temporal noise.

Table 1 below compares the interlaced shared-pixels architecture disclosed herein with non-interlaced shared-pixels architectures.

TABLE 1

| | Avg. H line/pix | Avg. V line/pix | V binning | Output / col. | Readout ckt/col. | 1 ch per color |
|---|---|---|---|---|---|---|
| 2 × 2 shared | 3 | 1 | No | 0.5 | 1 | No |
| 2 × 2 tg shared | 2 | 1 | No | 0.5 | 1 | No |
| 4 × 1 shared | 1.5 | 2 | Yes | 1 | 1 | No |
| I4shared | 3 | 2 | Yes | 1 | 2 | Yes |
| I4tgshard | 2 | 2 | Yes | 1 | 2 | Yes |

As shown by Table 1, the previous shared architectures were more limited than the integrated shared architectures disclosed herein. As shown in Table 1, a 2×2 shared-pixels architecture may provide an average of 3 horizontal lines per pixel, one average vertical line per pixel, no vertical binning, 0.5 outputs colors per column, one readout circuit per column, and no single channel per color capability. A 2×2 transfer gate shared-pixels architecture may provide an average of 2 horizontal lines per pixel, one average vertical line per pixel, no vertical binning, 0.5 outputs colors per column, one readout circuit per column, and no single channel per color capability. A 4×1 shared-pixels architecture may provide an average of 1.5 horizontal lines per pixel, 2 average vertical lines per pixel, vertical binning, 1 output color per column, one readout circuit per column, and no single channel per color capability. An integrated shared-pixels architecture may provide an average of 3 horizontal lines per pixel, 2 average vertical lines per pixel, vertical binning, 1 output color per column, 2 readout circuits per column, and single channel per color capability. An integrated transfer gate shared-pixels architecture may provide an average of 2 horizontal lines per pixel, 2 average vertical lines per pixel, vertical binning, 1 output color per column, 2 readout circuits per column, and single channel per color capability.

Figure 3A:
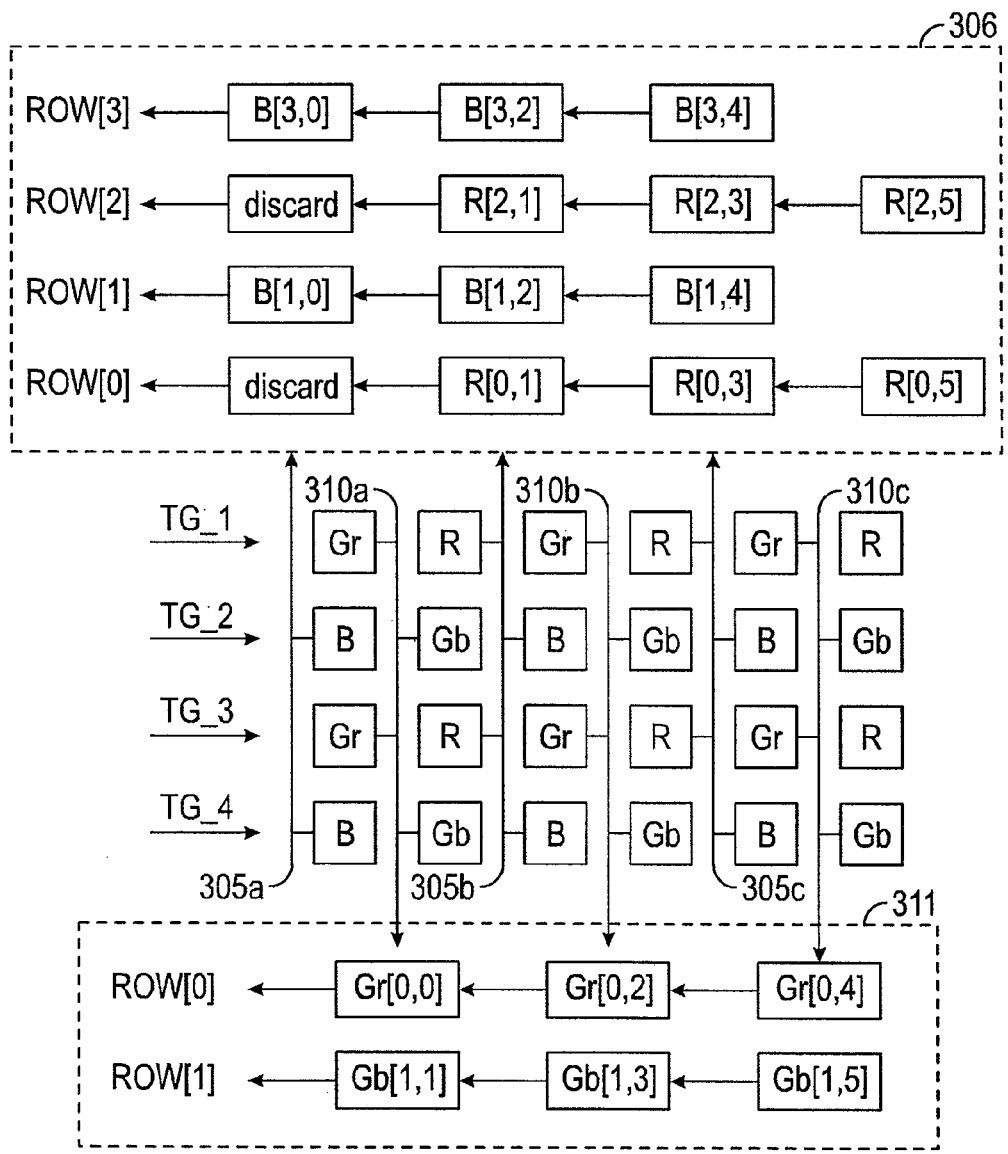
FIG. 3A illustrates a 4 color-per-channel readout sequence of a 1×4 interlaced 4-shared-pixels architecture, in accordance with an exemplary embodiment.

FIG. 3A illustrates a 4 color-per-channel readout sequence of a 1×4 interlaced 4-shared-pixels architecture, in accordance with an exemplary embodiment. FIG. 3A depicts an example of an array of red, blue, and green pixels in a Bayer configuration. Each of the pixels in the array may be referenced according to their respective row and column number, [r,c], where 'r' represents the row number and 'c' represents the column number. For example, pixel [0,0] may correspond to the Gr pixel in the top-left corner of the array, where the top row is row 0 and the left-most column is column 0. Each column and row of pixels of the array comprises two colors of pixels in an alternating fashion. For example, row [0] comprises green pixels Gr and red pixels R, while row [1] comprises blue pixels B and green pixels Gb. Similarly, column [0] comprises green pixels Gr and blue pixels B, while column [1] comprises red pixels R and green pixels Gb. Additionally, each pixel is coupled to a vertical readout channel of the plurality of vertical readout channels 305 (upward) and 310 (downward). The vertical readout channels 305a-305c may correspond to the vertical readout channels 205, while the vertical readout channel 310a-310c may correspond to the vertical readout channels 210, as referenced in FIG. 2. In the 1×4 interlaced 4-shared-pixels architecture as shown, the green Gr and green Gb pixels are coupled to the same downward readout channels 310a-310c, while the red R and blue B pixels are coupled to the same upward readout channels 305a-305c. On the left side of the pixel array are shown representative signals TG_1, TG_2, TG_3, and TG_4, each corresponding to one of the rows 0, 1, 2, and 3, respectively. The signals TG_1, TG_2, TG_3, and TG_4 may correspond to the signals received on the buses of the same designation as referenced in FIG. 2. Accordingly, when the TG_1 bus indicates a signal to the TG1 transfer gates, the pixels of the row to which the TG1 transfer gates are connected (here, row 0) are readout vertically.

The diagram shows how the charges from the colored pixels are readout of the shared-pixels architecture and "dumped" into sample-and-hold capacitors in parallel and later shifted out sequentially based on the selection signal SEL (not shown in this figure) and the transfer gate signals TG_1-TG_4. As shown by the embodiment in FIG. 3A, each color is readout as a separate color channel when readout according to a timing scheme, thus allowing each color channel to have a different gain applied to it to reach a desired color fidelity and/or white balance (e.g., different color processing per channel is available, as discussed above). When the TG_1 signal is received by the respective transfer gate TG1, the pixels in row 0 may be readout on their corresponding readout channels 305 and 310. Thus, a readout of the pixels in row 0 may result in Gr pixel [0,0] being readout by downward readout channel 310a, R pixel [0,1] being readout by upward readout channel 305b, Gr pixel [0,2] being readout by downward readout channel 310b, R pixel [0,3] being readout by upward readout channel 305c, and Gr pixel [0,4] being readout by downward readout channel 310c. Similarly, the remaining rows 1-3 may be readout into the sample-and-hold capacitors. In some embodiments, each readout channel 305a-305c and 310a-310c may feed into a separate sample-and-hold capacitor. In some other embodiments, the sample-and-hold capacitors may be shared between two or more readout channels 305a-305c and 310a-310c.

The diagram further shows the sequence of channel readouts separated by corresponding row numbers, referred to as banks 306 and 311. For example, in bank 306, the first upward readout channel 305a collects charges from the blue pixels of column 0, as shown by the first column of readout charges {discard, B[1,0], discard, B[3,0]}. The "discard" charges are charges that are ignored because there is no pixel to be readout. For example, the row 0 readout for upward readout channel 305a may be discarded because there is no column of pixels to the left of the upward readout channel 305a, so the upward readout channel 305a reads out a value that does not correspond to a charge of an existing pixel. Accordingly, values that are readout that do not correspond to charges from existing pixels may be simply discarded or ignored. Charges B[1,0] and B[3,0] represent the charges from the two blue pixels in column 0 in rows 1 and 3, respectively.

Similarly, upward readout channel 305b reads out charged {R[0,1], B[1,2], R[2,1], B[3,2]}, gathering the red and blue charges from both columns 1 and 2, and upward readout channel 305c gathers the red and blue charges from both columns 3 and 4, resulting in {R[0,3], B[1,4], R[2,3], B[3,4]}. Thus, the sequence of channel readouts separated by corresponding row numbers indicates what pixel was readout in by a particular channel. For example, as indicated in FIG. 3A, for row[0], readout channel 305a had a discarded charge value, readout channel 305b had a charge from the red pixel at [0,1], readout channel 305c had the charge from the red pixel at [0,3], and readout channel 305d (not shown in this figure) had the charge from the red pixel at [0,5]. The sequence of channel readouts for the remaining rows 1-3 for the upward readout channels 305a-305d and the rows 0-3 for the downward readout channels 310a-310c depict charge sources in a similar fashion. The sequence of channel readouts for downward readout channels 310a-310c may be shown in bank 311.

As shown in FIG. 3A, the charges in the pixels may be readout in parallel across each column, as each column for a given row only receives a charge from a single color pixel to be stored in the respective sample-and-hold capacitors. Subsequently, the charges in the sample-and-hold capacitors are shifted out sequentially. In order to keep the Bayer pattern group in the readout charges, the data have to be aligned correctly, or readout according to a given pattern or time sequence. For example, the odd-numbered rows of bank 306 may be delayed by one "horizontal" clock (e.g., one pixel time), while the even and odd rows of bank 311 may also be delayed by one "horizontal" clock. Once the charge is shifted out sequentially from the sample-and-hold capacitors, the remaining readout process is similar as that of a linear 1×4 structure.

The vertical sharing as shown in FIG. 3A is similar to the traditional vertical shared interlaced pixels architecture. Additionally, the shared architecture is capable of charge binning in both the horizontal and vertical directions. Charge binning may be important because it allows the charge in more than one pixel/photodiode to be combined in either or both of the horizontal and vertical directions in the analog domain. This charge binning may thus boost the charge capacity (e.g., the total available charge) that may be saved from the photodiodes. Pixel level binning made available by the interlaced shared-pixels architecture may provide for better low-light performance, where capturing and displaying full resolution of an image may be difficult. Charge binning may boost the output level by combining the outputs of horizontal and vertical pixels. For example, with regards to the interlaced shared-pixels architecture 105 and 110 shown in FIGS. 1B-2, the adjacent red, blue, green-odd and green-even photodiodes shown in each four transistor four-shared-pixels architecture 105 and 110 may be combined into a single pixel output when combined with proper timing schemes (e.g., horizontal binning) and then combined vertically with outputs from other four transistor four-sharedpixels architectures (e.g., vertical binning). Such binning may be useful in "preview modes" as provided in various imaging devices, where, because previous modes tend to display an image at a reduced resolution, the preview mode generated by an array of interlaced shared-pixels architectures may be of a higher resolution than those generated by non-interlaced shared-pixels architectures.

Figure 3B:
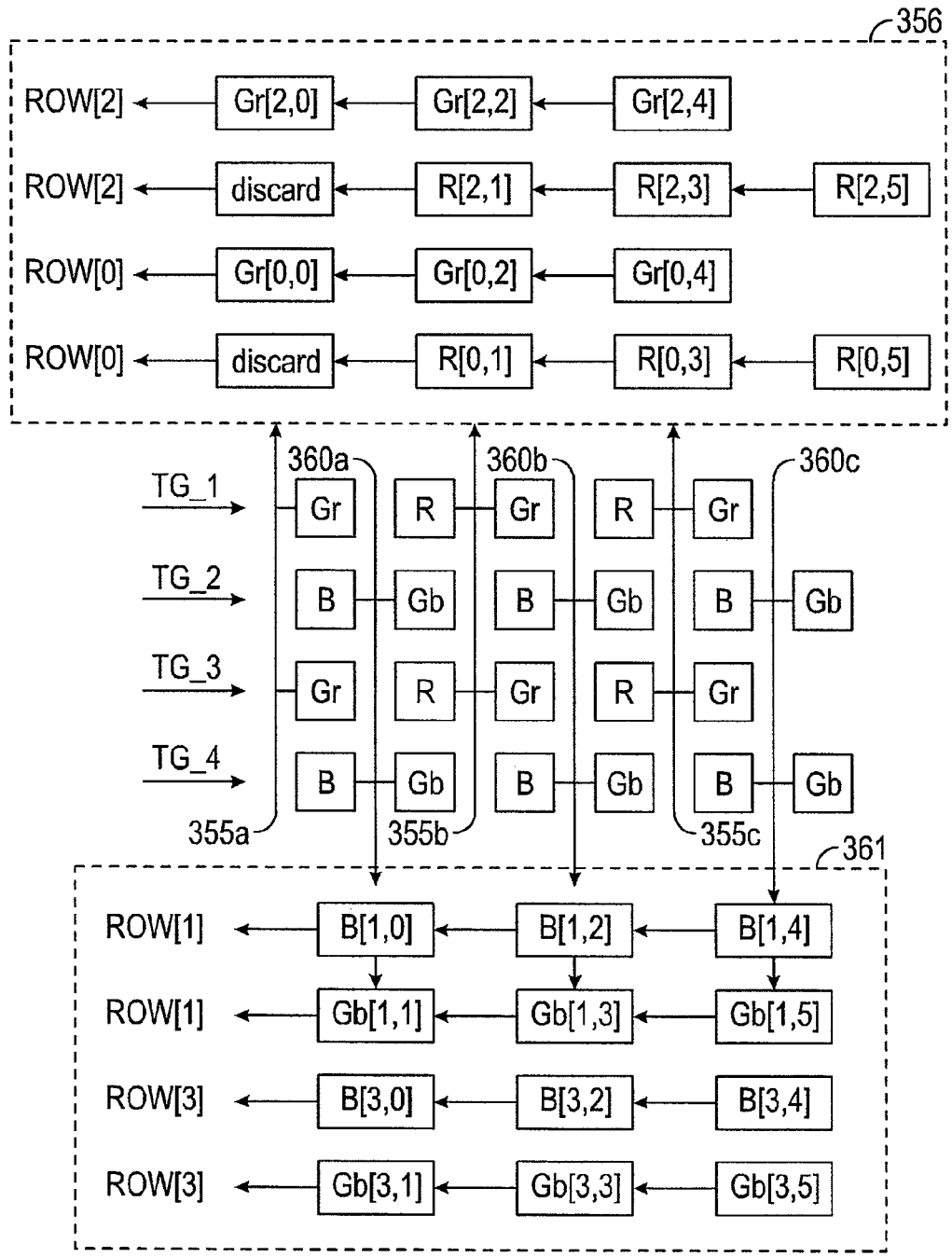
FIG. 3B illustrates a 4 color-per-channel readout sequence of a 2×2 interlaced 4-shared-pixels architecture, in accordance with an exemplary embodiment.

FIG. 3B illustrates a 4 color-per-channel readout sequence of a 2×2 interlaced 4-shared-pixels architecture, in accordance with an exemplary embodiment. FIG. 3B depicts an example of an array of red, blue, and green pixels in a Bayer configuration. Each of the pixels in the array may be referenced according to their respective row and column number, [r,c], where 'r' represents the row number and 'c' represents the column number. For example, pixel [0,0] may correspond to the Gr pixel in the top-left corner of the array, where the top row is row 0 and the left-most column is column 0. Each pixel may be coupled to a vertical readout channel of the plurality of vertical readout channels 355 (upward) and 360 (downward). The vertical readout channels may correspond to the vertical readout channels 205 and 210 as referenced in FIG. 2. In the 2×2 interlaced 4-shared-pixels architecture as shown, the green Gr and red R pixels are coupled to the same upward readout channels 355a-355d, while the green Gb and blue B pixels are coupled to the same downward readout channels 360a-360c. On the left side of the pixel array are shown representative signals TG_1, TG_2, TG_3, and TG_4, each corresponding to one of the rows 0, 1, 2, and 3, respectively. The signals TG_1, TG_2, TG_3, and TG_4 may correspond to the signals received on the buses of the same designation as referenced in FIG. 2. Accordingly, when the TG_1 bus indicates a signal to the TG1 transfer gates, the pixels of the row to which the TG_1 transfer gates are connected (here, row 0) are readout vertically.

The diagram shows how the charges from the colored pixels are readout of the shared-pixels architecture and "dumped" into sample-and-hold capacitors in parallel and later shifted out sequentially based on the selection signal SEL (not shown in this figure) and the transfer gate signals TG_1-TG_4, according to a timing scheme (not shown in this figure). When the TG_1 signal is received by the respective transfer gate TG1, the pixels in row 0 may be readout on their corresponding readout channels 355 and 360. Thus, a readout of the pixels in row 0 may result in Gr pixel [0,0] being readout by upward readout channel 355a, R pixel [0,1] being readout by upward readout channel 355b, Gr pixel [0,2] being readout by upward readout channel 355b, R pixel [0,3] being readout by upward readout channel 355c, and Gr pixel [0,4] being readout by upward readout channel 355c. Similarly, the remaining rows 1-3 may be readout into the upward and downward sample-and-hold capacitors. In some embodiments, each readout channel 355a-355d and 360a-360c may feed into a separate sample-and-hold capacitor. In some other embodiments, the sample-and-hold capacitors may be shared between two or more readout channels 355a-355d and 360a-360c. Accordingly, in the 2×2 interlaced 4-shared-pixels structure, each row of pixels is read out on alternating readout channels. The single channel per color may be maintained by reading out specific colored pixels and specific times, such that only red pixels may be read out vertically at a given time, while green Gr pixels are readout vertically on the same channel at a different time.

The diagram further shows the sequence of channel readouts separated by corresponding row numbers, referred to as banks 356 and 361. For example, in bank 356, the first upward readout channel 355a collects charges from the green Gr pixels of column 0, as shown by the first column of readout charges {discard, Gr[0,0], discard, Gr[2,0]}. The "discard" charges are charges that are ignored because there is no pixel to be readout. For example, the row 0 readout for upward readout channel 305a may be discarded because there is no column of pixels to the left of the upward readout channel 305a, so the upward readout channel 305a reads out a value that does not correspond to a charge of an existing pixel. Accordingly, values that are readout that do not correspond to charges from existing pixels may be simply discarded or ignored. Charges Gr[0,0] and Gr[2,0] represent the charges from the two green Gr pixels in column 0 in rows 0 and 2, respectively.

Similarly, upward readout channel 305b reads out charges {R[0,1], Gr[0,2], R[2,1], Gr[2,2]}, gathering the red and green Gr charges from both columns 1 and 2, and upward readout channel 305c gathers the red and green Gr charges from both columns 3 and 4, resulting in {R[0,3], Gr[0,4], R[2,3], Gr[2,4]}. Thus, the sequence of channel readouts separated by corresponding row numbers indicates what pixel(s) was readout by a particular channel. For example, as indicated in FIG. 3B, for row[0], readout channel 305a had a discarded charge value, readout channel 305b had a charge from the red pixel at [0,1], readout channel 305c had the charge from the red pixel at [0,3], and readout channel 305d (not shown in this figure) had the charge from the red pixel at [0,5]. The sequence of channel readouts for the remaining rows 1-3 for the upward readout channels 305a-305d and the rows 0-3 for the downward readout channels 310a-310c depict charge sources in a similar fashion. The sequence of channel readouts for downward readout channels 310a-310c may be shown in bank 361.

As shown in FIG. 3B, the charges in the pixels may be readout in parallel across each column, as each column for a given row receives a charge from two color pixels to be stored in the respective sample-and-hold capacitors. Subsequently, the charges in the sample-and-hold capacitors are shifted out sequentially. In order to keep the Bayer pattern group in the readout charges, the data have to be aligned correctly, or readout according to a given pattern or time sequence. For example, the odd-numbered rows of bank 356 may be delayed by one "horizontal" clock, while the even and odd rows of bank 361 may also be delayed by one "horizontal" clock. Once the charge is shifted out sequentially from the sample-and-hold capacitors, the remaining readout process is similar as that of a square (non-interlaced) 2×2 structure.

The reset and readout schemes and sequences for the two architectures displayed in FIGS. 3A and 3B are similar though applied to different physical designs of location and routing of pixel control buses and components (for example, transfer gates, reset, selection, and amplifying transistors).

Figure 4A:
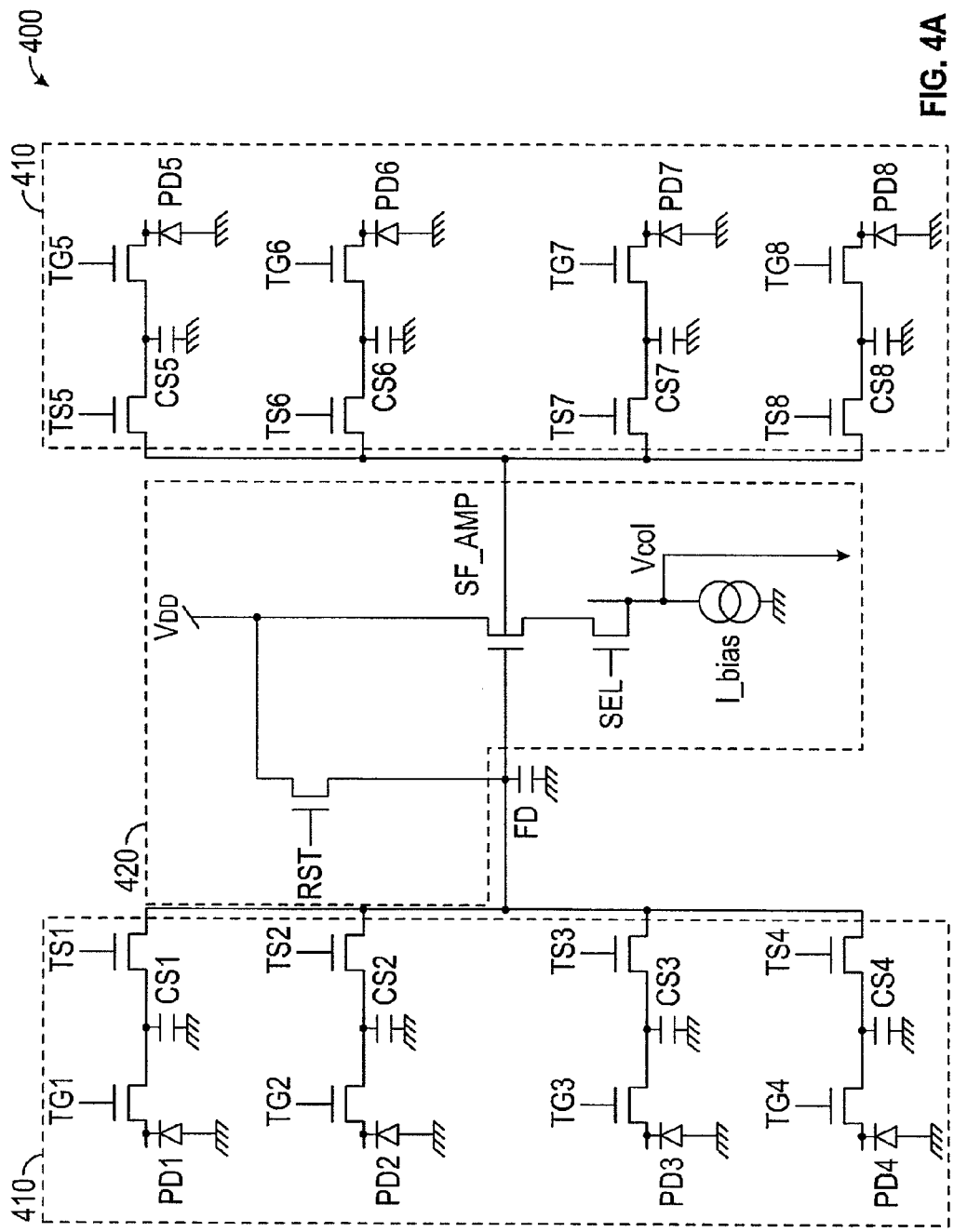
FIG. 4A illustrates an embodiment of an interlaced four transistor 8-shared image sensor pixels architecture 400 having a pixel readout system, in accordance with an exemplary embodiment.

FIG. 4A illustrates an embodiment of an interlaced four transistor 8-shared image sensor pixels architecture 400 having a pixel readout system, in accordance with an exemplary embodiment. Some embodiments of the image sensor can be a solid-state image sensor, for example a CMOS image sensor, which has eight four transistor (4T) pixels sharing pixel circuitry and a compact layout. The 4T 8-shared-pixels architecture 400 can be used as the pixel architecture for pixels in the pixel array, in some embodiments. The 4T 8-shared-pixels architecture 400 includes eight pixels, and though many such pixels may be arranged in the array, for simplicity only one 4T 8-shared-pixels architecture 400 is shown in greater detail.

The 4T 8-shared-pixels architecture 400 includes eight photodiode circuits, a floating diffusion node FD, a reset transistor RST, a voltage supply VDD, a source follower amplifier SF_AMP, a selector transistor SEL, an output voltage node Vcol, and a current source Ibias. In some embodiments, the photodiode circuits may each comprise a photodiode PD1-PD8, a transfer gate TG1-TG8, a storage capacitor CS1-CS8, and a timing circuit TS1-TS8. As mentioned above, in some embodiments the floating diffusion node FD may represent one or more floating diffusion points dedicated to one photodiode circuit or shared between multiple photodiode circuits. The readout circuitry components depicted in FIG. 4A can perform similar functions as described above with respect to FIGS. 1A-2. These components can be shared by the eight separate photodiode circuits having their associated photodiodes PD1-PD8, transfer gates TG1-TG8, storage capacitors CS1-CS8, and timing circuits TS1-TS8. Sharing of the floating diffusion node FD, source follower amplifier SF_AMP, row select transistor SEL, and reset transistor RST between adjacent photodiode circuits (for example, in series) assists in increasing the fill factor of the pixel architecture, the fill factor representing the percentage of the pixel area that is sensitive to light. The illustrated architecture 400 results in approximately 1.5 transistors per pixel. In some embodiments of the photodiodes PD1-PD8, two photodiodes may be used to detect a red component of incoming light, four photodiodes may be used to detect a green component of incoming light, and two photodiodes may be used to detect a blue component of incoming light, in accordance with a Bayer color pattern.

As described above, in some embodiments the timing circuits TS1-TS8 of the photodiode circuits can include high-speed logic for regulating the number of charge dumps sent from the photodiodes PD1-PD8 to the storage capacitors CS1-CS8 and for determining when to open to allow the charge in the respective storage capacitors CS1-CS8 to be readout via the floating diffusion node. In some embodiments, only one storage capacitor of the storage capacitors CS1-CS8 may be readout by the readout circuitry at one time. Thus, the timing circuits TS1-TS8 may be coordinated so that no two are open together. By accumulating multiple charge dumps from the photodiodes PD1-PD8 in the analog domain, device power can be saved in comparison to accumulating multiple charge dumps from the photodiodes PD1-PD8 in the digital domain. The accumulated charge can be read out from the storage capacitors CS1-CS8 through the floating diffusion node FD, through the source follower SF_AMP, and through the select transistor SEL to the output voltage node Vcol.

FIG. 4A also illustrates one embodiment of partitioning of the pixel array and pixel circuitry into separate, stacked structures (e.g., silicon wafers). A stacked structure may be desired where the number of components and general layout of the shared-pixels architecture limits the area available for light absorption. For example, with reference to FIGS. 1B and 2, all of the components depicted may be placed on the same layer (for example, the same piece of silicon). As can be seen, the limited area may be easily filled by the shared components and individual photodiodes PD, transfer gates TG, storage capacitors CS, and timing circuits TS. As discussed above, the large number of components reduces the amount of light capable of being absorbed by the photodiodes PD because some of the light may reflect off of or be blocked by these components and structures coupling the components in the area of the photodiode PD. Additionally, as more components (e.g., transistor, contacts, or buses) are introduced into the shared-pixels interlaced array architecture co-planar with the photodiodes PD, less space may be available and more light may be blocked from reaching the photodiodes PD where stacking is not utilized.

Alternatively, the components of the shared pixels architecture may be separated onto different layers in a stacked pixel structure. For example, a first portion including the photodiodes PD1-PD8, the corresponding transfer gates TG1-TG8, the corresponding storage capacitors CS1-CS8, the corresponding timing circuits TS1-TS8, and the floating diffusion node FD can be placed in a photodiode wafer 410 configured to integrate charge from incoming light. A second portion including the reset transistor RST, the voltage supply VDD, the source follower amplifier SF_AMP, the selector transistor SEL, the output voltage node Vcol, and the current source Ibias can be placed in a pixel circuitry wafer 420. In some embodiments the pixel circuitry wafer 420 may be constructed on top of the photodiode wafer 410 opposite the side exposed to incoming light. Accordingly, the surface space for detecting the incoming light can be increased through both the space-saving design of the shared-pixels architecture as well as the separation of the photodiodes and the pixel circuitry into different wafers. When the pixel circuitry components and structures are located on an individual layer (e.g., the pixel circuitry wafer 420), more real estate is made available for absorbing the incoming light on the photodiode wafer 410.

Depending upon the shared-pixels architecture used, the division of components may change, and/or the connection point(s) between the various layers may change. For example, in the interlaced shared-pixels architecture, the connection points between the bottom and top layers may be the floating diffusion nodes. For example, in some embodiments, the timing circuitry TS and source follower amplifier SF_AMP of the pixel circuitry wafer 420 can be connected to the floating diffusion node FD of the photodiode wafer. In some other embodiments, for example the 2×2 shared-pixels architecture, the connection points may be the row/column interconnections.

The separation or partitioning of the shared architecture into the three-dimensional stack configuration is not a trivial matter. The relocation of components between the various layers may be limited by current technology (for example, the determination between fusion bonds or fine-pitch hybrid bonds, as will be discussed below), and the partitioning and locating of the various components may impact the performance of the shared-pixels architecture. For example, the signal-to-noise ratio, the charge capacity, or how well the background noise may be suppressed may each be impacted by the partitioning of the components between the various 3-D layers.

In one embodiment, the photodiode wafer 410 may be configured as a back side illuminated (BSI) image sensor, wherein the photodiodes PD1-PD8, transfer gates TG1-TG8, the storage capacitors CS1-CS8, and the timing circuits TS1-TS8 described above are integrated into the BSI image sensor. The BSI image sensor may have a structure attached thereto to provide support for the BSI image sensor, which may have a lower structural integrity due to manufacturing and design constraints (e.g., due to the BSI image sensor having to be very thin to allow for light to penetrate to the silicon substrate, the BSI image sensor wafer may be fragile and susceptible to damage). In some embodiments, the structure supporting the BSI image sensor wafer may be a "dummy" or "blank" silicon wafer; accordingly, the components placed in the pixel circuitry wafer 420 may be integrated into the support wafer used to provide structural support for the BSI image sensor. Thus, the BSI image sensor may be designed to be more sensitive to light, wherein the electrical components used to generate and readout signals in response to sensed light may be more efficiently located structurally. In some embodiments, the components as indicated as being on the photodiode wafer 410 or the pixel circuitry wafer 420 may be manipulated or changed such that different components are on different wafers than as shown in FIG. 4A. For example, in some embodiments, components of the shared-pixels architecture may be separated between the photodiode wafer 410 and the pixel circuitry wafer 420 based on having similar electrical characteristics, manufacturing techniques, operational restrictions, or any other characteristic that may affect the design, manufacture, or operation of the imaging sensor being designed or the components integrated into the imaging sensor.

In some embodiments, various other 3D stacked designs or technologies may be implemented and may partition circuit components, elements, and blocks by ways of various stacked technologies and characteristics (for example, pad pitch or density). Such designs and implementations may deliver superior detector performance which 2D sensor configurations may not fulfill.

In some embodiments, the components integrated into the upper layer (e.g., the pixel circuitry wafer 420) may be connected with the components integrated into the lower layer (e.g., the photodiode wafer 410) via a connection at one or more connection points. In some embodiments, the floating diffusion node FD may be configured to function as the connection point between the upper layer (the pixel circuitry layer 420) and the lower layer (the photodiode wafer 410) via a fine-pitch hybrid bond. In some embodiments, the floating diffusion nodes may be configured to function as the connection point between the upper layer and the lower layer via a fusion bond. The reset transistor RST and source follower amplifier SF_AMP of the pixel circuitry wafer 420 can be connected to the floating diffusion node FD of the photodiode wafer 410. More details regarding the fine-pitch hybrid bonds will be provided below in relation to FIG. 5A, while additional details regarding the fusion bonds will be provided in relation to FIG. 5B. Various other types of bonds may be utilized to couple the upper and lower layers of wafers.

Figure 4B:
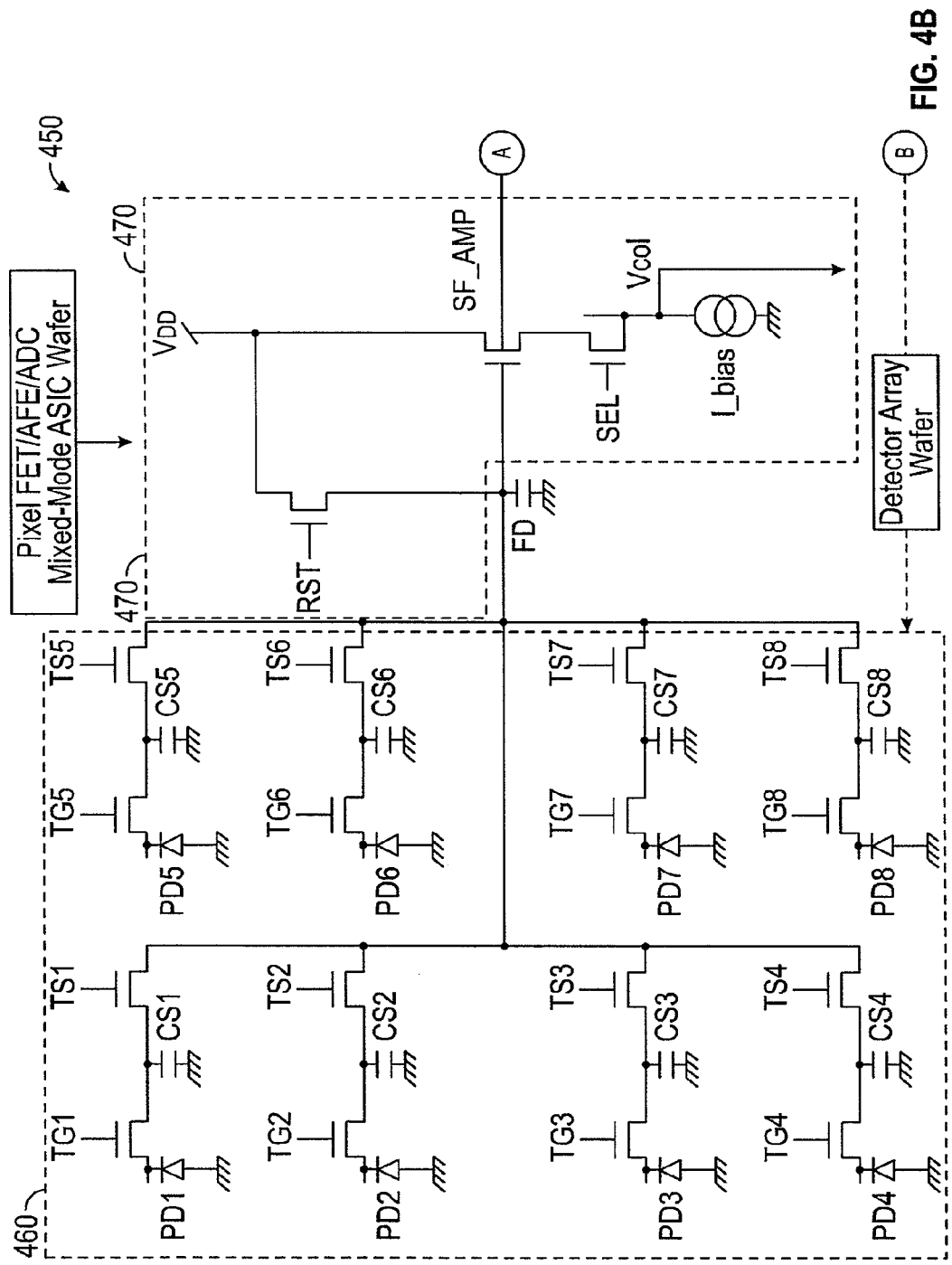
FIG. 4B illustrates a first section of an embodiment of a four transistor 16-shared image sensor pixel architecture 450 having a pixel readout system, in accordance with an exemplary embodiment, having connection points A-B to indicate continuation of elements on FIG. 4C.
Figure 4C:
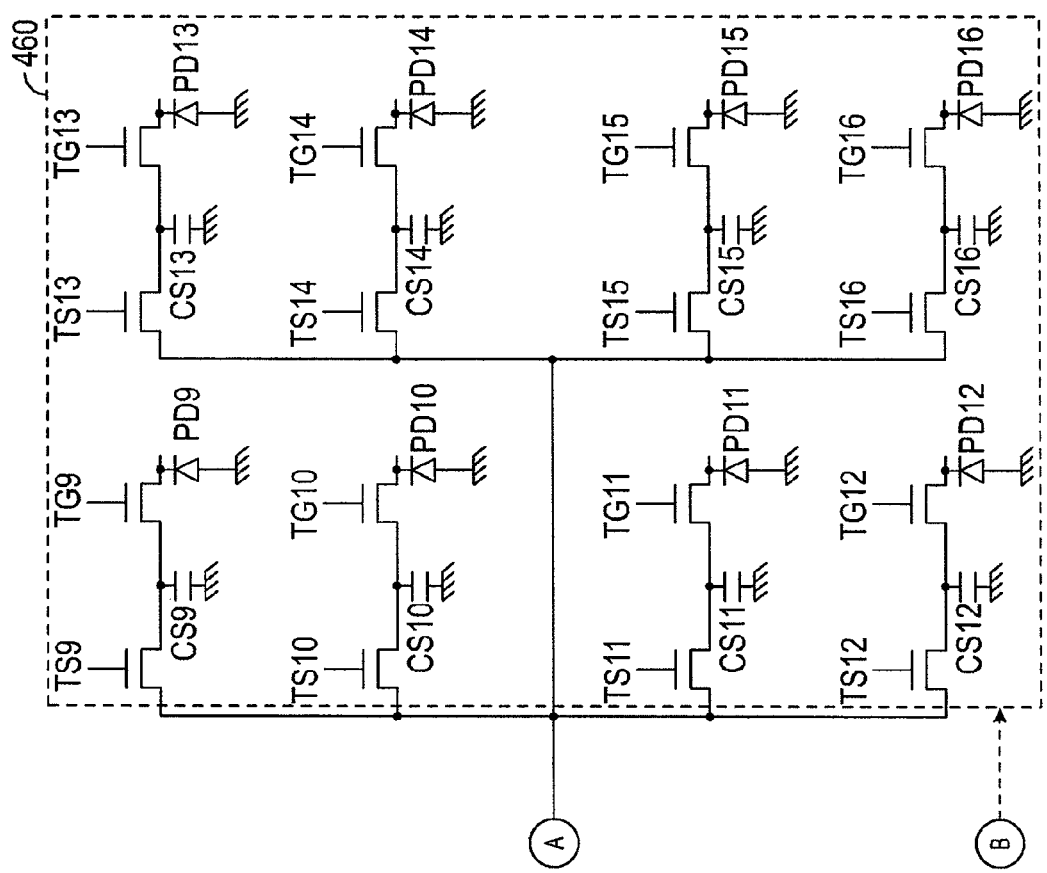
FIG. 4C illustrates a second section of an embodiment of a four transistor 16-shared image sensor pixel architecture 450 having a pixel readout system, in accordance with an exemplary embodiment, having connection points A-B to indicate continuation of elements on FIG. 4B.

FIG. 4B and FIG. 4C illustrate two sections of an embodiment of a four transistor 16-shared image sensor pixel architecture 450 having a pixel readout system, in accordance with an exemplary embodiment, wherein connection points A-B indicate continuation of elements between the FIGS. 4B and 4C. Some embodiments of the image sensor can be a solid-state image sensor, for example a CMOS image sensor, which has sixteen 4T pixels sharing pixel circuitry and a compact layout. The 4T 16-shared-pixels architecture 450 can be used as the pixel architecture for pixels in the pixel array. The 4T 16-shared-pixels architecture 450 includes sixteen pixels, and though many such pixels are arranged in the array, for simplicity only one 4T 16-shared-pixels architecture 450 is shown in greater detail.

The 4T 16-shared-pixels architecture 450 includes sixteen photodiodes circuits, a floating diffusion node FD, a reset transistor RST, a voltage supply VDD, a source follower amplifier SF_AMP, a selector transistor SEL, an output voltage node Vcol, and a current source Ibias. As mentioned above, in some embodiments the floating diffusion node FD may represent one or more floating diffusion points dedicated to one photodiode circuit or shared between multiple photodiode circuits. The components of FIGS. 4B and 4C can perform similar functions as described above with respect to FIGS. 1A and 4A. The components of the readout circuitry can be shared by sixteen separate photodiode circuits. The photodiode circuits, as described above in relation to FIGS. 1A and 4A, may comprise the photodiodes PD1-PD16, the transfer gates TG1-TG16, the storage capacitors CS1-CS16, and the timing circuits TS1-TS16. Sharing of the floating diffusion node FD, the source follower amplifier SF_AMP, the row select transistor SEL, and the reset transistor RST between adjacent photodiode circuits may assist in increasing the fill factor of the pixel architecture, the fill factor representing the percentage of the pixel area that is sensitive to light. The illustrated architecture 450 results in approximately 1.25 transistors per pixel. In some embodiments, of the photodiodes PD1-PD16, four photodiodes may be used to detect a red component of incoming light, eight photodiodes may be used to detect a green component of incoming light, and four photodiodes may be used to detect a blue component of incoming light. As can be seen from comparing the 4-shared, 8-shared, and 16-shared-pixels architectures, the greater the number of shared-pixels, the smaller the effective transistors-per-pixel results.

As described above, in some embodiments the timing circuits TS1-TS16 of the photodiode circuits can include high-speed logic for regulating the number of charge dumps sent from the photodiodes PD1-PD16 to the storage capacitors CS1-CS16 and for determining when to open to allow the charge in the respective storage capacitors CS1-CS16 to be readout via the floating diffusion node. In some embodiments, only one storage capacitor of the storage capacitors CS1-CS16 may be readout by the readout circuitry at one time. Thus, the timing circuits TS1-TS16 may be coordinated so that no two are open together. By accumulating multiple charge dumps from the photodiodes PD1-PD16 in the analog domain, device power can be saved in comparison to accumulating multiple charge dumps from the photodiodes PD1-PD16 in the digital domain. The accumulated charge can be read out from the storage capacitors CS1-CS16 through the floating diffusion node FD, through the source follower SF_AMP, and through the select transistor SEL to the output voltage node Vcol.

FIGS. 4B and 4C also illustrate one embodiment of partitioning of the pixel array and pixel circuitry into separate, stacked structures (e.g., silicon wafers), similar to that described above in relation to FIG. 4A. For example, a first portion including the photodiodes PD1-PD16, the corresponding transfer gates TG1-TG16, the corresponding storage capacitors CS1-CS16, the corresponding timing circuits TS1-TS16, and the floating diffusion node FD can be placed in a photodiode wafer 460 configured to integrate charge from incoming light. A second portion including the reset transistor RST, the voltage supply VDD, the source follower amplifier SF_AMP, the selector transistor SEL, the output voltage node Vcol, and the current source Ibias can be placed in a pixel circuitry wafer 470. In some embodiments, one or more of these components may be placed in a third pixel circuitry wafer, not shown in this figure. Accordingly, the surface space for detecting light can be increased through both the space-saving design of the shared-pixels architecture as well as the separation of the photodiode circuits and the pixel circuitry into different wafers. The surface space for detecting light may be increased because when the pixel circuitry structures and components forming the same are located on the same layer as the photodiode circuits, e.g., the photodiode wafer 460, the available real estate for absorbing light is reduced (for example, the light is reflected or blocked by the components or the connections there between and thus not absorbed by the photodiodes PD1-PD16).

When the pixel circuitry components and structures are located on an individual layer (e.g., the pixel circuitry wafer 470), more real estate is made available for absorbing light on the photodiode wafer 460 by the photodiodes PD1-PD16. For example, the photodiode wafer 460 may be configured as a back side illuminated (BSI) image sensor, wherein the components described above as being placed in the photodiode wafer 460 are integrated into the BSI image sensor. A BSI image sensor may have a structure attached thereto to provide support for the BSI image sensor, which may have a lower structural integrity due to manufacturing and design constraints (e.g., due to the BSI image sensor having to be very thin to allow for light to penetrate to the silicon substrate, the BSI image sensor wafer may be fragile and susceptible to damage). In some embodiments, this structure supporting the BSI image sensor wafer may be a "dummy" or "blank" silicon wafer; accordingly, the components placed in the pixel circuitry wafer 470 may be integrated into the support wafer used to provide structural support for the BSI image sensor. Thus, the BSI image sensor may be designed to be more sensitive to light, wherein the electrical components used to generate and readout signals in response to sensed light may be more efficiently located structurally in a manner that increases the area with which the photodiode PD may absorb light. In some embodiments, the components as indicated as being on the photodiode wafer 460 or the pixel circuitry wafer 470 may be manipulated or changed such that different components are on different wafers than as shown in FIGS. 4B and 4C. For example, in some embodiments, components of the shared-pixels architecture may be separated between the photodiode wafer 460 and the pixel circuitry wafer 470 based on having similar electrical characteristics, manufacturing techniques, operational restrictions, or any other characteristic that may affect the design, manufacture, or operation of the imaging sensor being designed or the components integrated into the imaging sensor.

In some embodiments, the components integrated into the upper layer (e.g., the pixel circuitry wafer 470) may be connected with the components integrated, into the lower layer (e.g., the photodiode wafer 460) via a connection at one or more connection points. In some embodiments, the floating diffusion node FD may be configured to function as the connection point between the upper layer (the pixel circuitry layer 470) and the lower layer (the photodiode wafer 460) via a fine-pitch hybrid bond. In some embodiments, the upper and lower layers may be connected via a fusion bond at the same or a different connection point than the floating diffusion node FD. The fusion bond may be used for row or column interconnections, wherein the readout of a full row or column is transferred to the upper layer. In some embodiments, the type of bonds between the upper and lower layers may determine, in part, the division of components between the upper layer and the lower layer. For example, when fusion bonds are used to couple the upper and lower layer, more of the components may be integrated into the lower layer. The selection transistor SEL and source follower amplifier SF_AMP of the pixel circuitry wafer 470 can be connected to the floating diffusion node FD of the photodiode wafer 460. More details regarding the fine-pitch hybrid bonds will be provided below in relation to FIG. 5A, while additional details regarding the fusion bonds will be provided in relation to FIG. 5B. In some embodiments, the photodiode wafer 460 may comprise a detector array wafer and the pixel circuitry wafer may comprise a Pixel FET/AFE/ADC Mixed-Mode ASIC Wafer, as shown in FIGS. 4B and 4C.

Figure 5A:
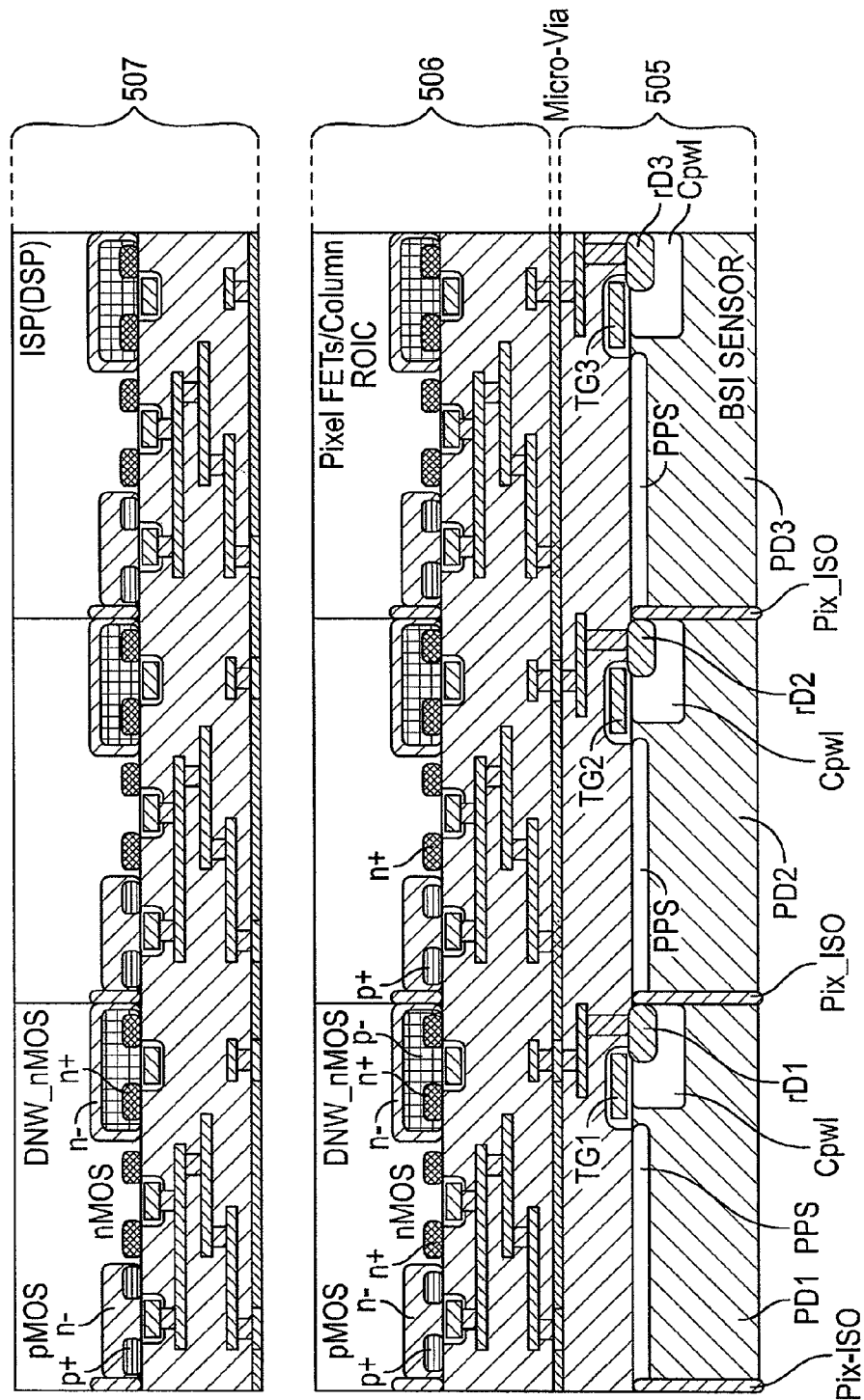
FIG. 5A illustrates an embodiment of a 3D stacked CMOS image sensor comprising the interlaced shared-pixels architecture of FIGS. 4A and 4B with pixel level fine-pitch hybrid bonding.

FIG. 5A illustrates an embodiment of a 3D stacked CMOS image sensor comprising the interlaced shared-pixels architecture of FIGS. 4A, 4B, and 4C with pixel level fine-pitch hybrid bonding. The 3D stacked CMOS image sensor depicts three distinct layers of the 3D stacked CMOS image sensor. The first (bottom) layer 505 may comprise the lower layer described above as being the photodiode wafer 410, 460. As shown in FIG. 5A, the first layer 505 may comprise a BSI sensor layer. The BSI sensor layer 505 as shown illustrates a sample of three photodiodes PD1-PD3 from the shared-pixels architectures of FIGS. 1A-1C. The photodiodes PD1-PD3 are shown having the transfer gates TG1-TG3, respectively, connecting the photodiodes PD1-PD3 to individual floating diffusion nodes FD1-FD3. The floating diffusion nodes FD1-FD3 are shown as each connecting to the middle layer 506 via individual fine-pitch hybrid bonds.

The second (middle) layer 506 may comprise the upper layer described above as being the pixel circuitry wafer 470. The second layer 506 may comprise the analog front end (AFE), A/D conversion circuitry, and the pixel circuitry described above. For example, the second layer 506 may comprise the reset transistor RST, the selection transistor SEL, the amplifying transistor SF_AMP, and the timing circuit TS with the storage capacitor CS. For BSI sensors as shown in the first layer 505, the second layer 506 may previously comprised the supporting wafer that provided structural support for the BSI sensor layers but did not provide any functional capabilities. As shown in FIG. 5A and as discussed above in relation to FIGS. 4A and 4B, the second layer 506 may be configured to provide structural support and functional support via the pixel circuitry components integrated into the second layer 506.

The third (top) layer 507 may be configured as the image signal processor or digital signal processing layer or readout circuitry layer. For example, the third layer 507 may comprise the logic chips or other circuitry configured to perform final processing and/or reading out of the signals generated by the BSI sensor and converted to digital form by the readout circuitry. In some embodiments, the third layer 507 may be excluded from the CMOS 3D stacked structure, and the components configured to further process the signal from the pixel circuitry may be integrated into the second layer 506.

As shown in FIG. 5A, an incoming light 510 to which the photodiodes PD1-PD3 are exposed may emit upward from the bottom of the figure, thereby allowing the majority of light generated to be incident on the photodiodes PD1-PD3 without having to pass through the pixel circuitry wafer 470. As discussed above, the relocation of the components for the pixel circuitry to the second layer 506 clears area on the first layer 505 that may not provide more exposure of the photodiodes PD1-PD3 to the light. Accordingly, the photodiodes PD1-PD3 may be more efficient, faster, Based on the light to which they are exposed, the photodiodes PD1-PD3 may generate current signals that may be transferred to the floating diffusion nodes when the respective transfer gate TG1-TG3 are activated via a signal from the transfer gate buses (not shown in this figure). Then the current signals in the floating diffusion nodes FD1-FD3 may be transferred to the pixel circuitry of the second layer 506 via the fine-pitch hybrid bonds. The pixel circuitry may then configure the current signals received via the fine-pitch hybrid bonds to be readout at 1-color per channel as described above in relation to FIGS. 2 and 3.

Figure 5B:
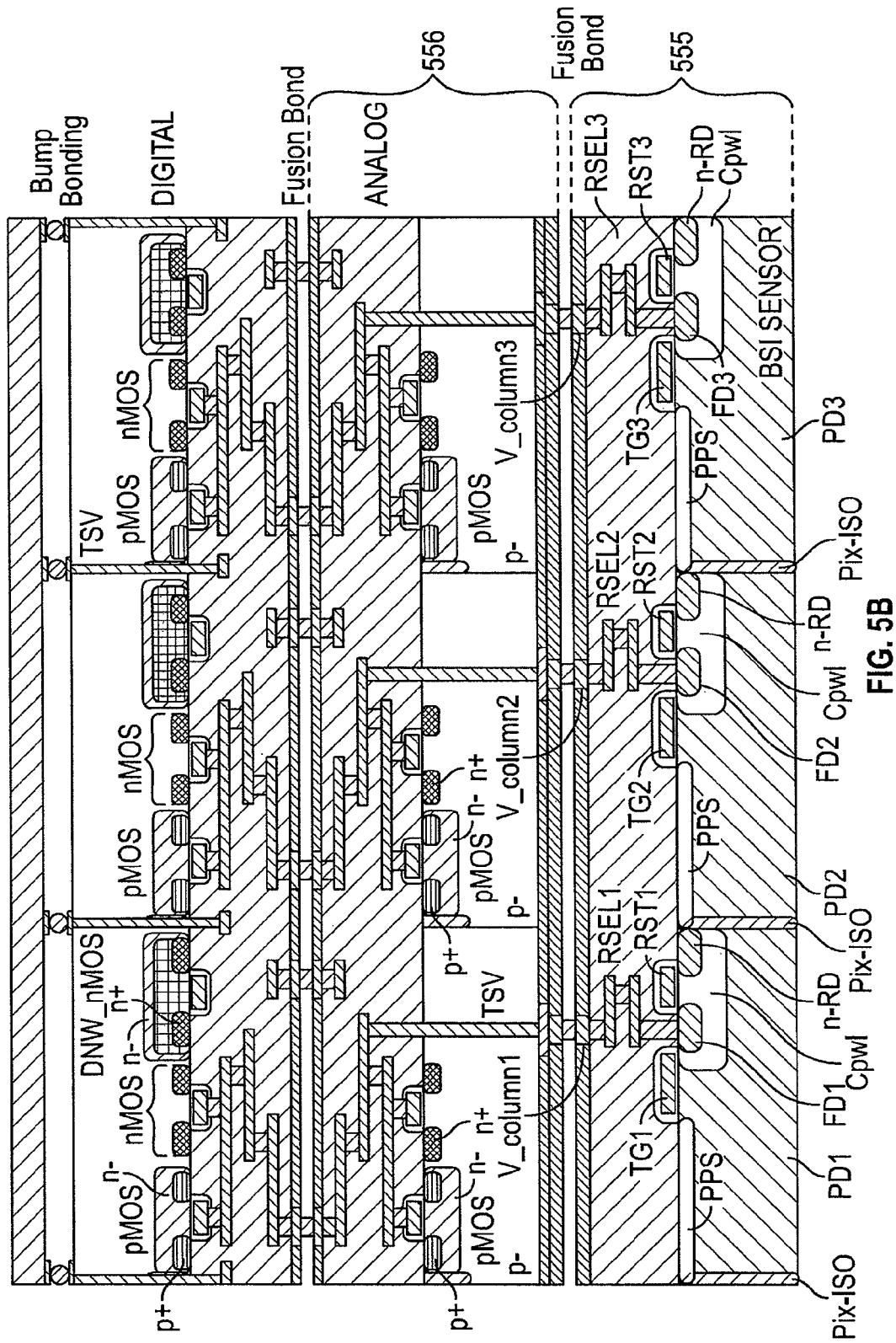
FIG. 5B illustrates another embodiment of a 3D stacked CMOS image sensor comprising the interlaced shared-pixels architecture of FIGS. 4A and 4B with column/row level fusion bonding.

FIG. 5B illustrates another embodiment of a 3D stacked CMOS image sensor comprising the interlaced shared-pixels architecture of FIGS. 4A and 4B with column/row level fusion bonding. In the embodiment depicted in FIG. 5B, there are four structural levels. The first (bottom) level 555 is identified as being the BSI sensor layer, while the second level 556 is identified as the analog front end (AFE) and analog digital conversion (ADC) layer, the third level 557 is identified as being the ISP/DSP, and the fourth (top) layer is the PC board substrate (PCB), for example F/R4. The structure and integrated components of the various layers may be similar to those of the layers 505-507 of FIG. 5A. In some embodiments, the structure and integrated components of the various layers may be different than those of the layers 505-507 of FIG. 5A. While the division of components between the first layer 505 and the second layer 506 of FIG. 5A corresponded to the division of components as shown in FIGS. 4A and 4B, the division of components between the first layer 555 and the second layer 556 of FIG. 5B may correspond to a division where the majority of the components of the photodiode circuit and the pixel circuit are on the same layer. For example, while FIGS. 4A and 4B depict the photodiodes PD1-PD3 and transfer gates TG1-TG3 as being on a detector array wafer 410, 460 while the shared pixel circuitry was separated on the pixel circuitry wafer 420, 470, the 3D cross-section shown in FIG. 5B represents a layout where all of the components of FIGS. 4A and 4B are integrated onto the same layer of silicon except for the current source Ibias and wherein the bottom layer is coupled to the middle layer via one or more fusion bonds.

For example, in the first layer 555, the photodiodes PD1-PD3 may be configured to convert light energy received via the light 560 flowing upward from the bottom of the page to current signals. The converted current signals may be transferred from the photodiodes PD1-PD3 to the floating diffusion nodes FD1-FD3 associated with each of the photodiodes PD1-PD3 via transfer gate transistors TG1-TG3 in response to receiving signal on the respective buses TG_1-TG_3 as referenced in FIGS. 4A and 4B.

The second layer 556 may comprise an analog layer. The second layer 556 may comprise the analog front end (AFE) and A/D conversion circuitry described above. For example, the second layer 556 may comprise the components configured to perform analog manipulation of the signals received from the BSI sensor layer (first layer 555). For BSI sensors as shown in the first layer 555, the second layer 556 may previously comprised the supporting wafer that provided structural support for the BSI sensor layers but did not provide any functional capabilities. As shown in FIG. 5B, the second layer 556 may be configured to provide structural support and functional support via the analog components integrated into the second layer 556. In some embodiments, the readout circuitry components may be integrated into the second layer 556. This circuitry may include the sample/hold capacitors discussed above and other components used to readout the charge values from the pixels.

The third layer 557 may be configured as the image signal processor or digital signal processing layer or readout circuitry layer. For example, the third layer 557 may comprise the logic chips or other circuitry configured to perform final processing and/or reading out of the signals generated by the BSI sensor and converted to digital form by the readout circuitry. In some embodiments, the third layer 557 may be excluded from the CMOS 3D stacked structure, and the components configured to further process the signal from the readout circuitry may be integrated into the third layer 557.

Figure 6A:
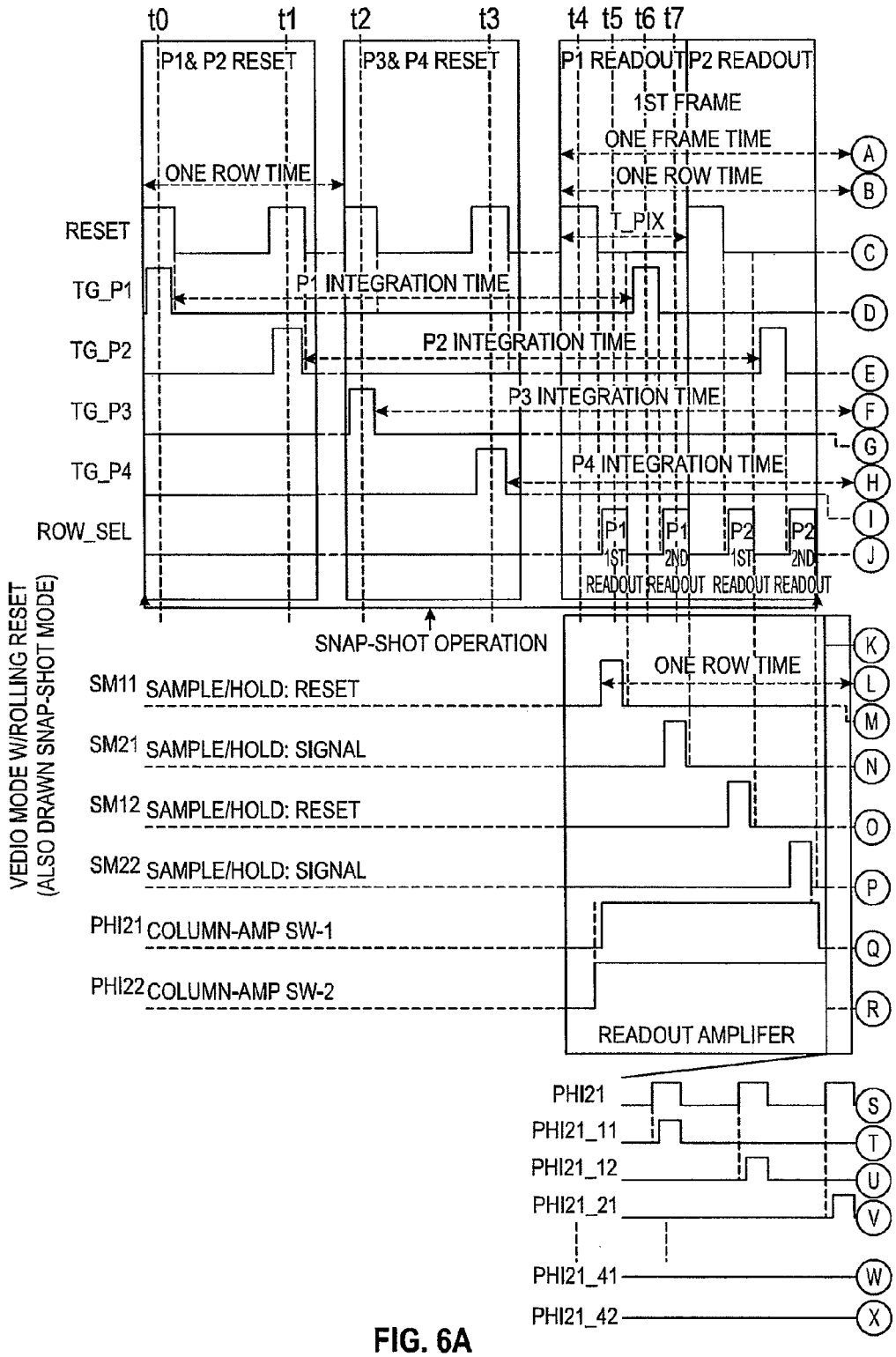
FIG. 6A illustrates a first section of a timing diagram of the interlaced four transistor 4-shared image sensor pixel architecture of FIG. 1B, in accordance with one exemplary embodiment, having connection points A-X to indicate continuation of elements on FIG. 6B.
Figure 6B:
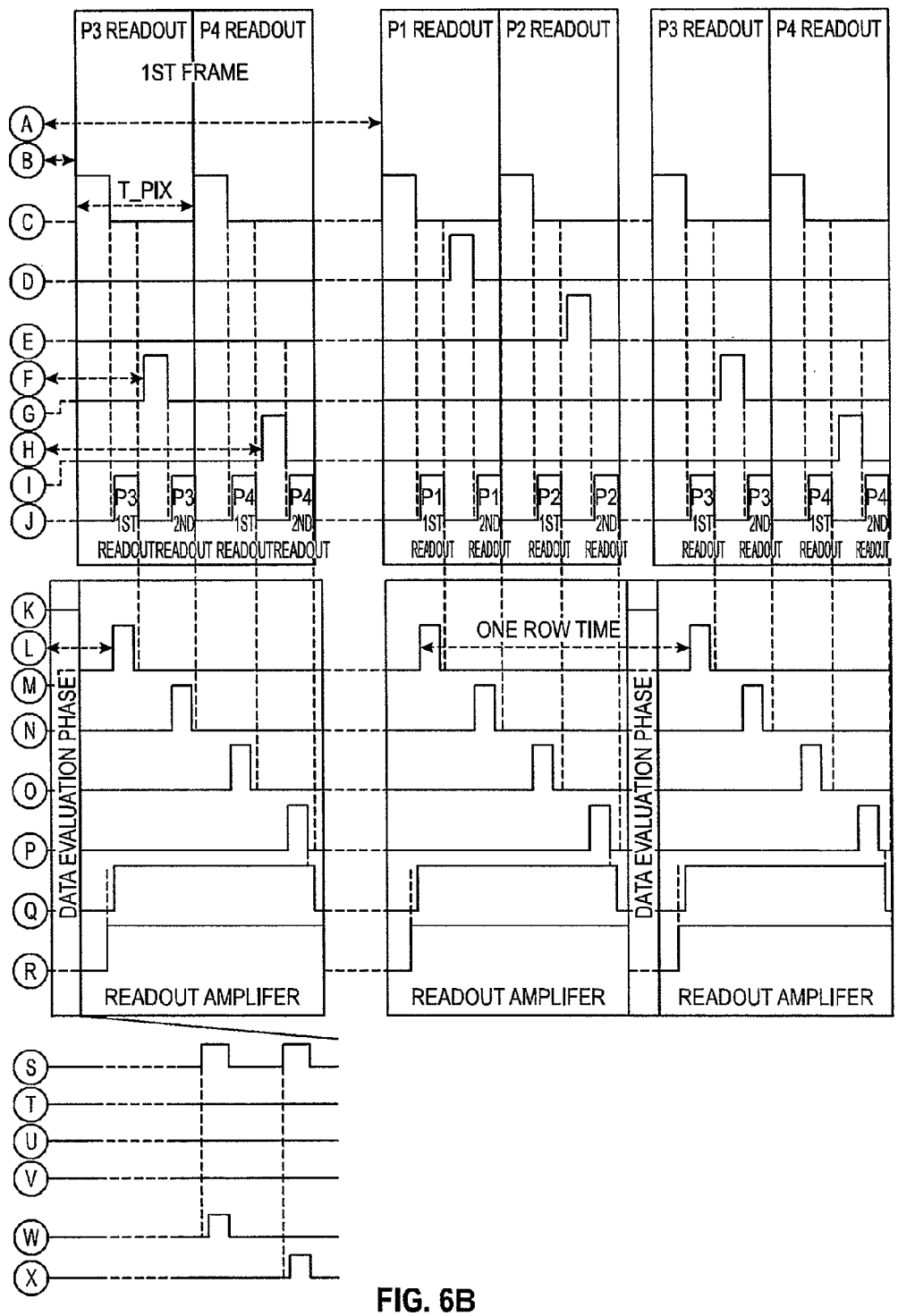
FIG. 6B illustrates a second section of a timing diagram of the interlaced four transistor 4-shared image sensor pixel architecture of FIG. 1B, in accordance with one exemplary embodiment, having connection points A-X to indication continuation of elements on FIG. 6A.

FIG. 6A and FIG. 6B illustrate two sections of a timing diagram of the interlaced four transistor 4-shared image sensor pixel architecture of FIG. 1B, in accordance with one exemplary embodiment, having connection points A-X to indicate continuation of elements between FIGS. 6A and 6B. FIGS. 6A and 6B show a timing diagram with time increasing along the x-axis and with the on-off activations of various signals along the y-axis. The various signals along the y-axis may correspond to transistors or other components of the pixel circuit described above or the readout circuit described above. The top half of the timing diagram shows activation timings for the Reset transistor (referred to as RES in FIGS. 1A-2; labeled "Reset" in FIGS. 6A and 6B), the transfer gates (referred to as TG1-TG4 in FIGS. 1A-2; labeled TG_P1, TG_P2, TG_P3, TG_P4 in FIGS. 6A and 6B), and timing for the activation of the row selection transistor (referred to as SEL in FIGS. 1A-2; labeled Row_Sel in FIGS. 6A and 6B). The bottom half of the timing diagram shows activation timings for components feeding various sample/hold capacitors (labeled SM11, SM21, SM12, and SM22 in FIGS. 6A and 6B) and column amplifying switches (labeled Phi21 and Phi22 in FIGS. 6A and 6B).

Thus, the activation timings of the transistors and other components are shown in conjunction with the activation timings of the sample and hold components SM11, SM21, SM12, and SM22 and column amplifying components Phi21 and Phi22. The timing diagram illustrates that the Reset transistor is activated periodically. When any of the transfer gates TG_P1-TG_P4 are activated at the same time as the Reset transistor, the photodiodes (referred to as PD1-PD4 in FIGS. 1A-2; labeled P1-P4 in FIGS. 6A and 6B) are Reset to a default voltage to which the Reset transistor is coupled. For example, at time t0, the Reset transistor and the transfer gate TG_P1 are shown as both being activated at the same time. Thus, at time t0, the photodiode coupled to the TG_P1 transfer gate (e.g., photodiode PD1) is reset to the coupled voltage. Each of the transfer gates TG_P1-TG_P4 are activated simultaneously with the reset transistor at different times, such that only a single transfer gate TG_P1-TG_P4 is activated concurrently with the reset transistor. Additionally, when the reset transistor Reset is active but none of the transfer gates TG_P1-TG_P4 is active, the storage capacitor or the floating diffusion node is reset to the coupled voltage.

The time period between activations for a transfer gate TG_P1-TG_P4 associated with a photodiode PD may represent the integration period of the photodiode coupled to the particular TG P1-TG_P4. For example, between time t0 and time t6, the photodiode coupled to the transfer gate TG_P1 (e.g., PD1) may integrate light and generate charge corresponding to the integrated light. At time t0, the photodiode PD1 may be reset when both the transfer gate transistor TG_P1 and the reset transistor Reset are activated at the same time. At time t6, the accumulated charge at PD1 may be transferred to a storage capacitor/floating diffusion node. As shown, each of the transfer gates TG_P1-TG_P4 have an integration time associated with them between subsequent activations of the respective transfer gates TG_P1-TG_P4. The row selection transistor Row_Sel indicates when the row selection transistor is activated for a readout of a particular transfer gate TG_P1-TG_P4 and photodiode combination. The photodiodes may integrate the light until the transfer gate TG_P1-TG_P4 associated with the photodiode is activated to transfer the integrated charge to the storage capacitor.

As indicated in FIGS. 6A and 6B, a "one row time" may indicate the amount of time that passes during which a single row of pixels is readout. As shown in FIGS. 6A and 6B, the readout of a row may comprise reading-out more than one pixel. For example, in FIG. 2, each of the four rows shown may comprise two different pixels. Similarly, the amount of time that passes between the beginning of a first P1 readout and a second, subsequent P1 readout may be defined as the "one frame time," wherein the pixels of a given frame are each readout. The 't_pix" time shown on the timing diagram may indicate the pixel time, which completed a sampling of the reset and signal levels of one single pixel during the readout period. When reading out all the pixels in a row, the time period is referred to as one row time.

As indicated in FIGS. 6A and 6B, the row selection transistor Row_Sel performs two readouts for each photodiode PD1-PD4. The two separate readouts of each photodiode PD1-PD4 may provide for compensation and/or reduction of noise. For example, at time t5, the row selection transistor Row_Sel is activated for a first readout of the storage capacitor and/or floating diffusion node. This initial readout occurs shortly after the storage capacitor and/or floating diffusion node is reset by the reset transistor Reset activating at time t4; this initial readout may provide the baseline for the noise associated with the readout. Subsequently, the transfer gate TG_P1 may be activated at time t6 to transfer the charge from the photodiode PD1 coupled to the transfer gate transistor TG_P1 to the storage capacitor and/or floating diffusion node. Then, after TG_P1 is activated at time t6, the row selection transistor Row_Sel is activated at time t7 for a second readout of the storage capacitor and/or floating diffusion node. This second readout may provide a readout value that may be corrected based on the baseline readout value. The two readouts indicated may correspond to the noise reduction measures described above. By performing two readouts, for example by sampling the storage capacitor before and after the transfer gate TG_P1-TG_P4 is turned on, correlated double sampling with a short sampling time can be performed, thus eliminating at least kTC noise. Furthermore, other types of noise may be eliminated or compensated for by implementing similar multiple-readout techniques.

In some embodiments, the readout column circuitry may comprise a sample/hold capacitor per column. In some embodiments, the readout column circuitry for an imaging system may comprise a pair of sample/hold capacitors per column. In either case, the sample/hold capacitor(s) may be used to reduce a noise readout of the imaging system, as described above. The signals SM11, SM21, SM12, and SM22 may represent the signals used to obtain the baseline (reference) and the readout (sample). For example, the SM11 sample/hold: reset signal may be used to obtain the baseline of the storage capacitor or floating diffusion node prior to the "dumping" of the charge from one of the photodiodes PD1-PD4 into the storage capacitor or floating diffusion node, as shown at time t5. Then, after the charge from the photodiode P1 is transferred into the storage capacitor or floating diffusion node at time t6, the SM21 sample/hold signal may be used to obtain the charge transferred from the photodiode P1. Then, the charge read at time t5 may be subtracted from the charge read at time t7 to obtain the readout value without the noise that is common between the baseline and the sampled values. The column-amp SW-1/SW-2 may represent the amplifying components that are amplifying the readout values from the top and bottom column readout channels, as depicted in FIG. 7.

Figure 7:
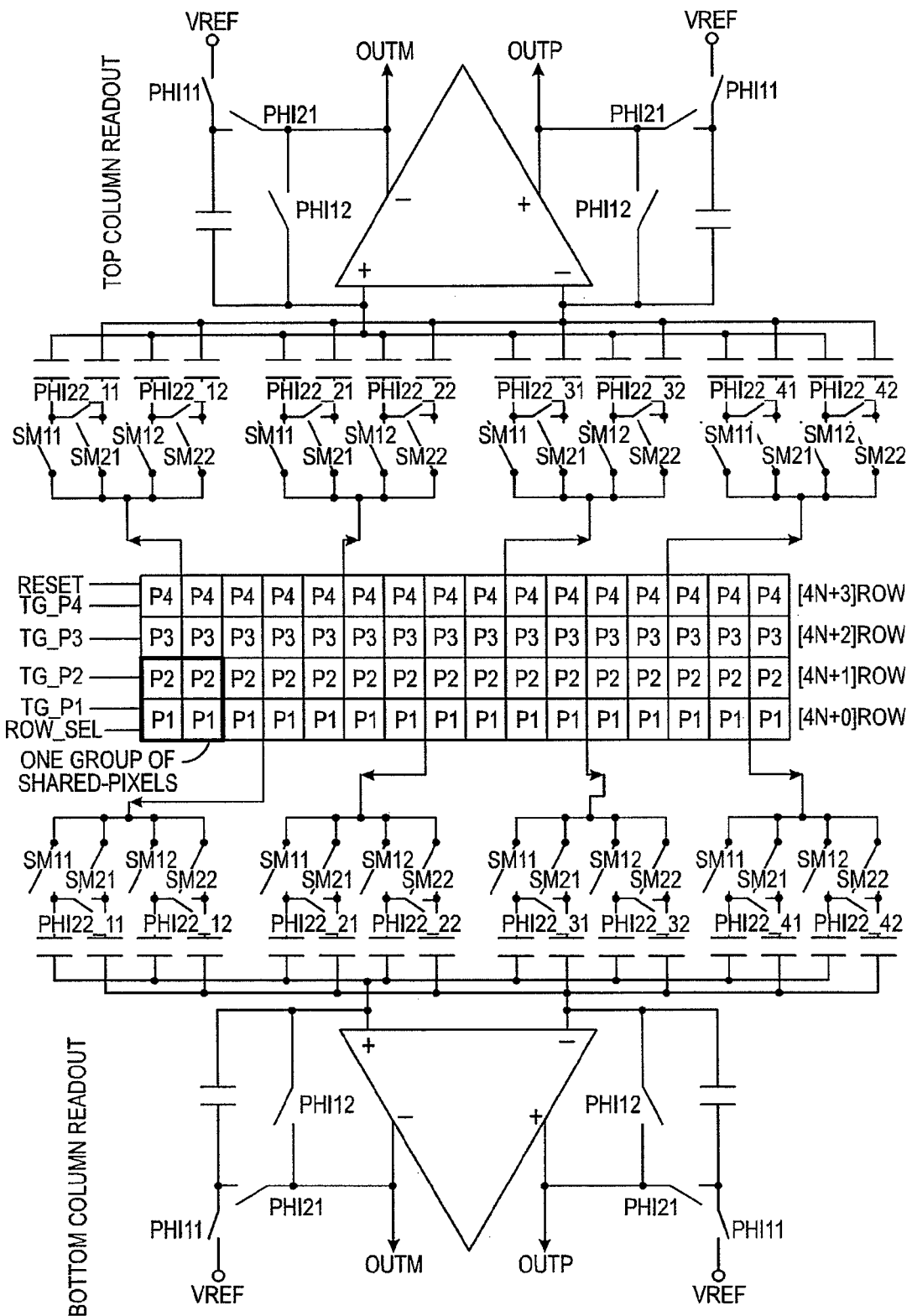
FIG. 7 illustrates an example of a readout block diagram of the interlaced four transistor 4-shared image sensor pixel architecture of FIG. 1B according to the timing diagram of FIGS. 6A and 6B.

FIG. 7 illustrates an example of a readout block diagram of the interlaced four transistor 4-shared image sensor pixel architecture of FIG. 1B according to the timing diagram of FIGS. 6A and 6B. As depicted, there are two readout circuits, one for the charges read out by the upward readout channel and one for the charges read out by the downward readout channel. The various components above and below the pixel array comprise the sampling switches, the sampling capacitors, the column addressing multiplexors and signal and reset buses, and the variable gain amplifier. These components, in combination, may receive signals from the pixel array, amplify the signals and multiplex the signals out to one or more video signals.

Overview of Example Imaging Device

Figure 8:
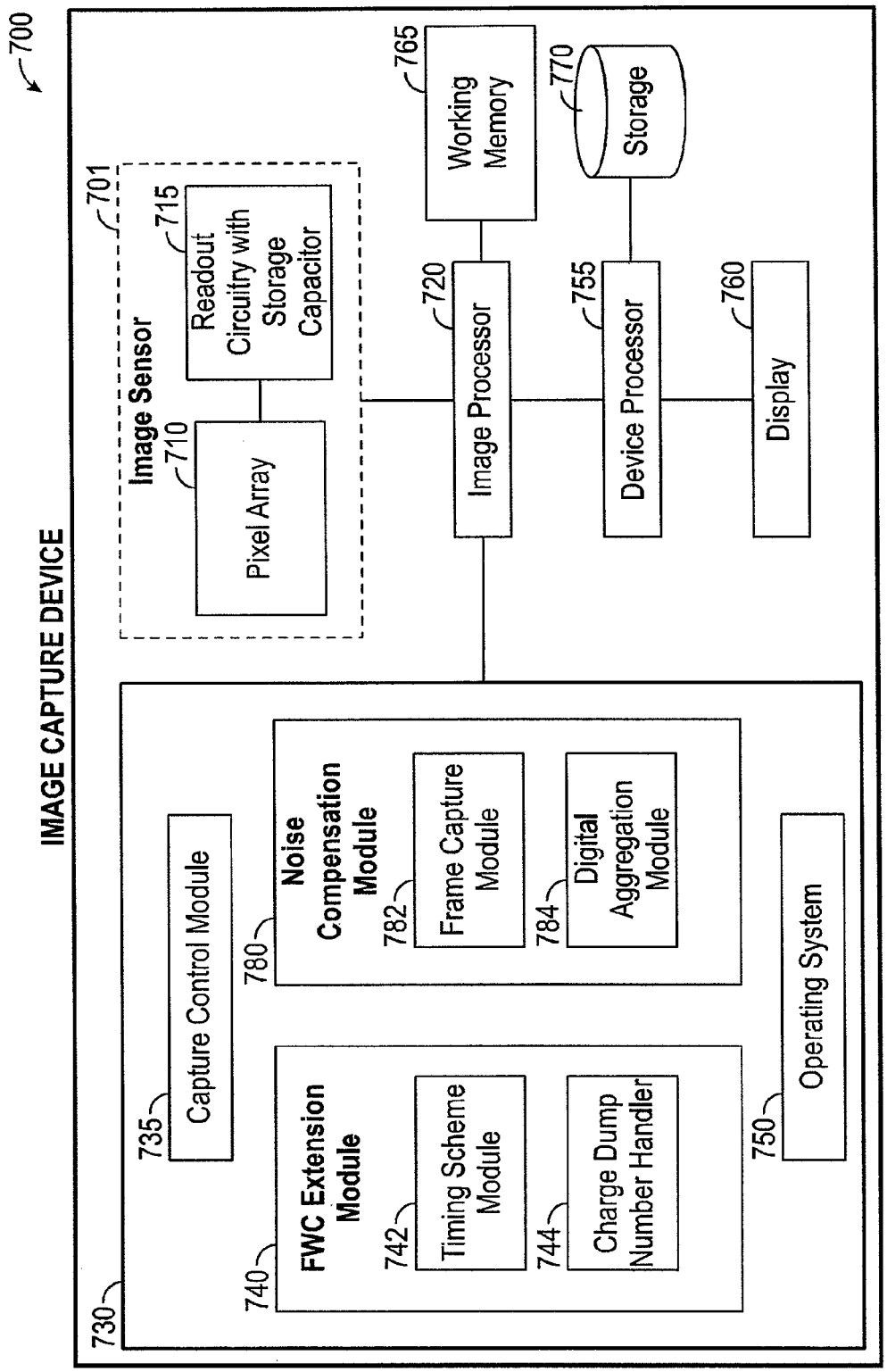
FIG. 8 illustrates a high-level schematic diagram of an embodiment of an image capture device with full well capacity extension capabilities.

FIG. 8 illustrates a high-level schematic diagram of an embodiment of an image capture device 700, the device 700 having a set of components including an image processor 720 linked to a camera 701 (image sensor). The image processor 720 is also in communication with a working memory 765, memory 730, and device processor 755, which in turn is in communication with storage 770 and an optional electronic display 760.

Device 700 may be a portable personal computing device, e.g. a mobile phone, digital camera, tablet computer, personal digital assistant, or the like. Device 700 may also be a stationary computing device or any device. A plurality of applications may be available to the user on device 700. These applications may include traditional photographic and video applications, for example applications relating to user management of number of charge dumps, number of differential frames, HDR imaging applications, and the like.

The image capture device 700 includes camera 701 for capturing external images. The camera 701 can include a pixel array 710 and readout circuitry with additional storage capacitor 715 as described above. In accordance with the architectures described above, the storage capacitors can have the capacitance to store a number of charge dumps from the associated pixel. The camera 701 can be configured for continuous or intermittent capture of preview frames, as well as capture of full resolution final images.

The image processor 720 may be configured to perform various processing operations on received preview frames. Processor 720 may be a general purpose processing unit or a processor specially designed for imaging applications. Examples of image processing operations include AWB and AEC data generation, LED current calculation, cropping, scaling (e.g., to a different resolution), image stitching, image format conversion, color interpolation, color processing, image filtering (e.g., spatial image filtering), lens artifact or defect correction, etc. Processor 720 may, in some embodiments, comprise a plurality of processors. Processor 720 may be one or more dedicated image signal processors (ISPs) or a software implementation of a processor.

As shown, the image processor 720 is connected to a memory 730 and a working memory 765. In the illustrated embodiment, the memory 730 stores capture control module 735, full well capacity extension module 740, noise compensation module 780, and operating system 750. The modules of the memory 730 include instructions that configure the image processor 720 of device processor 755 to perform various image processing and device management tasks. Working memory 765 may be used by image processor 720 to store a working set of processor instructions contained in the modules of memory 730. Alternatively, working memory 765 may also be used by image processor 720 to store dynamic data created during the operation of device 700.

Full well capacity extension module 740 can store sub-modules timing scheme module 742 and charge dump number handler module 744. Together, these modules can cooperate to perform the tasks relating to determining each pixel's integration time and multiple charge dumps from the pixel to the storage capacitor in the readout architecture.

Noise compensation module 780 can store sub-modules frame capture module 782 and digital aggregation module 784. In some embodiments, frame capture module 782 can be provided with instructions that configure the processor 720 to perform the process 500 described above by providing instructions to the readout circuitry of the image sensor. In some embodiments, digital aggregation module 784 can be provided with instructions that configure the processor 720 to perform the process 600 described above to aggregate multiple charges in the digital domain.

As mentioned above, the image processor 720 is configured by several modules stored in the memories. The capture control module 735 may include instructions that configure the image processor 720 to adjust the focus position of camera 701. Capture control module 735 may further include instructions that control the overall image capture functions of the device 700. For example, capture control module 735 may include instructions that call subroutines to configure the image processor 720 to capture preview image data or full resolution image data including one or more frames of a target image scene using the camera 701.

Operating system module 750 configures the image processor 720 to manage the working memory 765 and the processing resources of device 700. For example, operating system module 750 may include device drivers to manage hardware resources for example the camera 701. Therefore, in some embodiments, instructions contained in the image processing modules discussed above may not interact with these hardware resources directly, but instead interact through standard subroutines or APIs located in operating system component 750. Instructions within operating system 750 may then interact directly with these hardware components. Operating system module 750 may further configure the image processor 720 to share information with device processor 755.

Device processor 755 may be configured to control the display 760 to display the captured image, or a preview of the captured image, to a user. The display 760 may be external to the imaging device 200 or may be part of the imaging device 200. The display 760 may also be configured to provide a view finder displaying a preview image for a use prior to capturing an image, for example present the user with a visual representation of the dynamic range of the image scene or with a user interface for manually adjusting the number of analog charge dumps and/or digitally accumulated differential frames. The display 760 may comprise an LCD or LED screen, and may implement touch sensitive technologies.

Device processor 755 may write data to storage module 770, for example data representing digitally accumulated differential frames. While storage module 770 is represented graphically as a traditional disk device, those with skill in the art would understand that the storage module 770 may be configured as any storage media device. For example, the storage module 770 may include a disk drive, e.g. a floppy disk drive, hard disk drive, optical disk drive or magneto-optical disk drive, or a solid state memory e.g. a FLASH memory, RAM, ROM, and/or EEPROM. The storage module 770 can also include multiple memory units, and any one of the memory units may be configured to be within the image capture device 700, or may be external to the image capture device 700. For example, the storage module 770 may include a ROM memory containing system program instructions stored within the image capture device 700. The storage module 770 may also include memory cards or high speed memories configured to store captured images which may be removable from the camera. The storage module 770 can also be external to device 700, and in one example device 700 may wirelessly transmit data to the storage module 770, for example over a network connection.

Although FIG. 8 depicts a device having separate components to include a processor, imaging sensor, and memory, one skilled in the art would recognize that these separate components may be combined in a variety of ways to achieve particular design objectives. For example, in an alternative embodiment, the memory components may be combined with processor components, for example to save cost and/or to improve performance.

Additionally, although FIG. 8 illustrates two memory components, including memory component 720 comprising several modules and a separate memory 765 comprising a working memory, one with skill in the art would recognize several embodiments utilizing different memory architectures. For example, a design may utilize ROM or static RAM memory for the storage of processor instructions implementing the modules contained in memory 730. The processor instructions may be loaded into RAM to facilitate execution by the image processor 720. For example, working memory 765 may comprise RAM memory, with instructions loaded into working memory 765 before execution by the processor 720.

Implementing Systems and Terminology

Implementations disclosed herein provide systems, methods and apparatus for increasing light absorption by photodiode pixels and enabling low-noise and high gain readouts, high resolution and high color-fidelity outputs, and increased dynamic range using 3-dimensional (3D) stacked, vertically integrated pixel architectures. One skilled in the art will recognize that these embodiments may be implemented in hardware, software, firmware, or any combination thereof.

In some embodiments, the circuits, processes, and systems discussed above may be utilized in a wireless communication device. The wireless communication device may be a kind of electronic device used to wirelessly communicate with other electronic devices. Examples of wireless communication devices include cellular telephones, smart phones, Personal Digital Assistants (PDAs), e-readers, gaming systems, music players, netbooks, wireless modems, laptop computers, tablet devices, etc.

The wireless communication device may include one or more image sensors, two or more image signal processors, a memory including instructions or modules for carrying out the CNR process discussed above. The device may also have data, a processor loading instructions and/or data from memory, one or more communication interfaces, one or more input devices, one or more output devices for example a display device and a power source/interface. The wireless communication device may additionally include a transmitter and a receiver. The transmitter and receiver may be jointly referred to as a transceiver. The transceiver may be coupled to one or more antennas for transmitting and/or receiving wireless signals.

The wireless communication device may wirelessly connect to another electronic device (e.g., base station). A wireless communication device may alternatively be referred to as a mobile device, a mobile station, a subscriber station, a user equipment (UE), a remote station, an access terminal, a mobile terminal, a terminal, a user terminal, a subscriber unit, etc. Examples of wireless communication devices include laptop or desktop computers, cellular phones, smart phones, wireless modems, e-readers, tablet devices, gaming systems, etc. Wireless communication devices may operate in accordance with one or more industry standards for example the 3rd Generation Partnership Project (3GPP). Thus, the general term "wireless communication device" may include wireless communication devices described with varying nomenclatures according to industry standards (e.g., access terminal, user equipment (UE), remote terminal, etc.).

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies for example infrared, radio, and microwave, then the coaxial cable, fiber optic cable, twisted pair, DSL, or wireless technologies for example infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It should be noted that the terms "couple," "coupling," "coupled" or other variations of the word couple as used herein may indicate either an indirect connection or a direct connection. For example, if a first component is "coupled" to a second component, the first component may be either indirectly connected to the second component or directly connected to the second component. As used herein, the term "plurality" denotes two or more. For example, a plurality of components indicates two or more components.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

In the foregoing description, specific details are given to provide a thorough understanding of the examples. However, it will be understood by one of ordinary skill in the art that the examples may be practiced without these specific details. For example, electrical components/devices may be shown in block diagrams in order not to obscure the examples in unnecessary detail. In other instances, such components, other structures and techniques may be shown in detail to further explain the examples.

Headings are included herein for reference and to aid in locating various sections. These headings are not intended to limit the scope of the concepts described with respect thereto. Such concepts may have applicability throughout the entire specification.

It is also noted that the examples may be described as a process, which is depicted as a flowchart, a flow diagram, a finite state diagram, a structure diagram, or a block diagram. Although a flowchart may describe the operations as a sequential process, many of the operations can be performed in parallel, or concurrently, and the process can be repeated. In addition, the order of the operations may be re-arranged. A process is terminated when its operations are completed. A process may correspond to a method, a function, a procedure, a subroutine, a subprogram, etc. When a process corresponds to a software function, its termination corresponds to a return of the function to the calling function or the main function.

The previous description of the disclosed implementations is provided to enable any person skilled in the art to make or use the present invention. Various modifications to these implementations will be readily apparent to those skilled in the art, and the generic principles defined herein may be applied to other implementations without departing from the spirit or scope of the invention. Thus, the present invention is not intended to be limited to the implementations shown herein but is to be accorded the widest scope consistent with the principles and novel features disclosed herein.

What is claimed is:

1. An imaging system comprising:
    a plurality of pixels configured to convert light into a charge, each pixel comprising:
    a photodiode,
    a transfer gate,
    a storage capacitor electrically connected in series with the photodiode via the transfer gate disposed between the photodiode and the storage capacitor, the storage capacitor having a capacitance for storage of an accumulated charge representing a plurality of charge dumps from the connected photodiode, each of the plurality of charge dumps comprising a charge representative of the light integrated in the connected photodiode, and
    a timing circuit electrically connected in series with the storage capacitor, the timing circuit configured to control the flow of charge from the storage capacitor to a floating diffusion node;
    one or more amplifier transistors configured to convert a charge from the plurality of pixels;
    one or more selection transistors configured to select a row or column of the plurality of pixels to be read out;
    one or more reset transistors configured to reset at least one of the plurality of pixels;

a pixel array including the plurality of pixels arranged in one or more shared pixel architectures, the pixel array configured to independently control the transfer gate of each pixel to dump each of the plurality of charge dumps from the respective photodiode to the respective storage capacitor and independently control the timing circuit of each pixel so that charge dumps from each storage diode to the floating diffusion node occur one pixel at a time;

a first silicon layer upon which the plurality of pixels are disposed; and a second silicon layer upon which at least one of the one or more amplifier transistors, selection transistors, and reset transistors are disposed.

2. The imaging system of claim 1, wherein the floating diffusion node is disposed on the first silicon layer and electrically coupled to the one or more amplifier transistors disposed on the second silicon layer.

3. The imaging system of claim 2, wherein the floating diffusion node disposed on the first silicon layer is electrically coupled to the one or more amplifier transistors disposed on the second silicon layer via a fine-pitch hybrid bond.

4. The imaging system of claim 2, wherein the floating diffusion node disposed on the first silicon layer is electrically coupled to the one or more amplifier transistors disposed on the second silicon layer via a fusion bond.

5. The imaging system of claim 1, wherein the one or more shared pixel architectures forming the pixel array are arranged in an interlaced manner and comprise the one or more amplifier transistors, one or more selection transistors, and one or more reset transistors being shared by at least a subset of pixels of the plurality of pixels.

6. The imaging system of claim 1, wherein one of the amplifier transistors, one of the selection transistors, and one of the reset transistors are shared among at least two pixels of the plurality of pixels.

7. The imaging system of claim 1, wherein, in each pixel, the timing circuit is connected in series with the corresponding transfer gate and the corresponding photodiode.

8. The imaging system of claim 1, wherein each of the shared pixel architectures comprises the one or more amplifier transistors configured to receive the accumulated charge from the storage capacitor of each pixel and the one or more selection transistors configured to activate the one or more amplifier transistors of a selected row of the plurality of pixels.

9. The imaging system of claim 1, wherein the photodiode of each pixel is configured to integrate light and convey the integrated light via the transfer gate of each pixel connected to the photodiode.

10. An imaging system comprising:

a plurality of sensor circuits configured to generate a charge when exposed to light from a target scene, each sensor circuit including:

a photodiode, a transfer gate connected to the photodiode, a storage capacitor coupled in series with the photodiode, the transfer gate disposed between the photodiode and the storage capacitor, the storage capacitor having a capacitance for storage of an accumulated charge representing a plurality of charge dumps from the coupled photodiode, each of the plurality of charge dumps comprising a charge representative of the light integrated in the coupled photodiode, and a timing circuit electrically coupled in series with the storage capacitor and to a floating diffusion node, the transfer gate disposed therebetween and configured to control the flow of charge from the storage capacitor to the floating diffusion node;

a plurality of readout circuits, each readout circuit comprising at least one of a reset transistor, a row selection transistor, and an amplifying transistor;

a plurality of shared sensor architectures comprising two or more of the plurality of sensor circuits;

a sensor array including the plurality of sensor circuits, the sensor array configured to independently control the transfer gate of each sensor circuit to dump each of the plurality of charge dumps from the respective photodiode to the respective storage capacitor and independently control the timing circuit of each sensor circuit so that charge dumps from each storage diode to the floating diffusion node occur one sensor circuit at a time;

a first layer of silicon including the plurality of shared sensor architectures; and a second layer of silicon including the plurality of readout circuits, the second layer positioned relative to the first layer in the imaging system such that the first layer is exposed to light incident on the imaging system from a target scene.

11. The imaging system of claim 10, wherein the amplifying transistor is configured to convert a charge from one or more sensor circuits.

12. The imaging system of claim 10, wherein the plurality of sensor circuits in the sensor array are arranged in a Bayer color pixel arrangement.

13. The imaging system of claim 10, further comprising at least one of a row and a column bus readout path disposed on the first silicon layer, wherein the at least one of the row and column readout path is coupled with a readout circuit disposed on the second layer of silicon.

14. The imaging system of claim 10, wherein the floating diffusion node is electrically coupled to one of the plurality of shared sensor architectures of the first silicon layer and one of the plurality of readout circuits of the second silicon layer via a fine- pitch hybrid bond.

15. The imaging system of claim 10, further comprising at least one of a row and a column bus readout path disposed on the first silicon layer electrically coupled to a readout circuit disposed on the second silicon layer, via a fusion bond.

16. An imaging system comprising:

a pixel array including a plurality of pixels configured to generate a charge when exposed to light, each of the plurality of pixels including a photodiode, a transfer gate connected to the photodiode, a storage capacitor electrically coupled in series with the photodiode, the transfer gate disposed between the photodiode and the storage capacitor, the storage capacitor having a capacitance for storage of an accumulated charge representing a plurality of the charge dumps from the coupled photodiode, each of the plurality of charge dumps comprising a charge representative of the light integrated in the coupled photodiode, and a timing circuit electrically coupled in series with the storage capacitor and configured to control the flow of charge from the coupled storage capacitor to a floating diffusion node;

a plurality of pixel readout circuits for reading light integrated in pixels coupled thereto, each of the plurality of pixel readout circuits comprising one or more transistors shared between at least a subset of the plurality of the pixels, the one or more transistors disposed on a second layer different than the first layer; and a plurality of floating diffusion nodes configured to couple each of the plurality of pixels to the plurality of pixel readout circuits, wherein the pixel array is configured to independently control the transfer gate of each pixel to dump each of the plurality of charge dumps from the photodiode to the storage capacitor and independently control the timing circuit of each pixel so that charge dumps from each storage diode to the floating diffusion node occur one pixel at a time.

17. The imaging system of claim 16, wherein the floating diffusion node is connected between the pixel readout circuit of each of at least two pixels and the storage capacitor of each pixel coupled thereto.

18. The imaging system of claim 17, wherein each pixel readout circuit comprises a reset transistor configured to reset at least one of the floating diffusion node and the photodiode and the storage capacitor of at least one pixel to a predetermined charge level.

19. The imaging system of claim 17, wherein the floating diffusion node is electrically coupled to the one or more transistors disposed on the second silicon layer via a fine-pitch hybrid bond.

20. The imaging system of claim 17, wherein the floating diffusion node is electrically coupled to the one or more transistors disposed on the second silicon layer via a fusion bond.

21. The imaging system of claim 16, wherein the one or more transistors includes an amplifier, and wherein the imaging system further comprises an analog to digital converter in communication with the amplifier to receive an amplified signal and convert the amplified signal into a digital signal, wherein the analog to digital converter is disposed on a third layer different from the first and second layers.

22. A method of manufacturing a 3D stacked image sensor, comprising:

forming a pixel array on a first silicon layer, the pixel array including a plurality of pixels arranged in one or more shared pixel architectures, each of the plurality of pixels comprising:

a photodiode, a transfer gate coupled to the photodiode, a storage capacitor electrically coupled in series with the photodiode, wherein the transfer gate is disposed between the photodiode and the storage capacitor, the storage capacitor having a capacitance for storage of an accumulated charge representing a plurality of charge dumps from the coupled photodiode, each of the plurality of charge dumps comprising a charge representative of the light integrated in the coupled photodiode, and a timing circuit electrically coupled in series with the storage capacitor, the timing circuit configured to control the flow of charge from the coupled storage capacitor to a floating diffusion node, wherein the pixel array is configured to independently control the transfer gate of each pixel to dump each of the plurality of charge dumps from the photodiode to the storage capacitor and independently control the timing circuit of each pixel so that charge dumps from each storage diode to the floating diffusion node occur one pixel at a time;

forming a readout circuit including at least one amplifier transistor, selection transistor, and reset transistor on a second silicon layer different from the first silicon layer; and forming the floating diffusion node electrically coupling two or more pixels of the first silicon layer to one readout circuit of the second silicon layer.

23. The method of manufacturing of claim 22, further comprising disposing one or more processing components, configured to manipulate a signal received from the at least one transistor disposed on the second silicon layer, on a third silicon layer different from the first and second silicon layers.

24. The method of manufacturing of claim 22, wherein electrically coupling two or more pixels of the first silicon layer to one readout circuit of the second silicon layer comprises coupling via a fine-pitch hybrid bond.

25. The method of manufacturing of claim 22, wherein electrically coupling two or more pixels of the first silicon layer to one readout circuit of the second silicon layer via a fusion bond.

26. The method of manufacturing of claim 22, wherein the shared pixel architectures forming the pixel array are arranged in an interlaced manner and comprise one or more amplifier transistors, one or more selection transistors, and one or more reset transistors being shared by a subset of pixels of the plurality of pixels.

27. The imaging system of claim 1, wherein the pixel array being configured to independently control the transfer gate of each pixel to dump each of the plurality of charge dumps from the photodiode to the storage capacitor comprises the pixel array being configured to control each transfer gate of the plurality of pixels to transfer the charge accumulated in the respective photodiode to the respective storage capacitor independent of each other transfer gate of the plurality of pixels.

* * * * *